United States Patent [19]

Blumenthal et al.

[11] Patent Number: 5,257,287
[45] Date of Patent: Oct. 26, 1993

[54] AUTOMATIC POLARITY DETECTION AND CORRECTION METHOD AND APPARATUS EMPLOYING LINKPULSES

[75] Inventors: Jeffrey M. Blumenthal, Austin, Tex.; Nader Vijeh; John M. Wincn, both of Cupertino, Calif.; Ian S. Crayford, San Jose, Calif.

[73] Assignee: Advanced Micro Devices Inc., Sunnyvale, Calif.

[21] Appl. No.: 620,980

[22] Filed: Nov. 30, 1990

Related U.S. Application Data

[63] Continuation-in-part of Ser. No. 480,426, Feb. 15, 1990, Pat. No. 5,164,960.

[51] Int. Cl.⁵ .............................................. H04L 25/34
[52] U.S. Cl. ........................................... 375/19; 341/55
[58] Field of Search ................ 375/17, 19, 94; 371/55, 371/70; 341/76

[56] References Cited

U.S. PATENT DOCUMENTS

| | | | |
|---|---|---|---|
| 3,783,383 | 1/1974 | Forster et al. | 375/19 |
| 3,828,346 | 8/1974 | Forster et al. | 375/19 |
| 3,889,235 | 6/1975 | Assmus et al. | |
| 4,012,589 | 3/1977 | Reisinger | |
| 4,387,366 | 6/1983 | Chow | 371/70 |
| 4,779,073 | 10/1988 | Iketani | 341/55 |

FOREIGN PATENT DOCUMENTS

| | | |
|---|---|---|
| 0316536 | 5/1989 | European Pat. Off. |
| 2537383 | 2/1977 | Fed. Rep. of Germany |
| 3906927 | 9/1989 | Fed. Rep. of Germany |

*Primary Examiner*—Stephen Chin
*Attorney, Agent, or Firm*—Townsend and Townsend Khourie and Crew

[57] ABSTRACT

A differential receiver incorporated into a MAU which receives both Manchester packets and linkpulses according to the IEEE 802.3 10Base-T standard has polarity detection and correction circuit for automatically detecting a reversed polarity for RD input lines. The differential receiver samples incoming pulses for time, amplitude and pulse width qualification and makes a preliminary polarity determination based upon polarity of such qualified pulses. This preliminary polarity allows a linktest state machine to transition to a link_pass state, enabling output drivers of the MAU. Additionally, the linkpulse polarity information initially makes a polarity determination for the entire differential receiver which asserts a FIX POLARITY signal. The FIX POLARITY signal controls a correction circuit which internally remedies reversed input lines. Preferably, the correction circuit internally reroutes the signals. An ETD polarity circuit makes polarity determinations from any ETD information received, as effected by the correction circuit. The ETD polarity circuit independently controls the linkpulse polarity determinations and conflicting determinations are resolved in favor of the ETD polarity circuit. Upon detecting two consecutive, consistent valid ETDs, the ETD polarity circuit locks-in the polarity determinations until a reset or a linkfail condition. The correction circuit effects both Manchester packets and linkpulses, so an incorrectly locked polarity will produce inverted linkpulses which will not allow the MAU to remain in the link_pass state. In the linkfail state, the MAU may reestablish the correct polarity.

45 Claims, 15 Drawing Sheets

| CONTROL SIGNAL | LINKFAIL | RXLINK |
|---|---|---|
| 1 | 1 | RXLNKPOS |
| 0 | 1 | RXLNKNEG |
| 1 | 0 | RXLNKPOS |
| 0 | 0 | RXLNKPOS |

FIG. 4A.

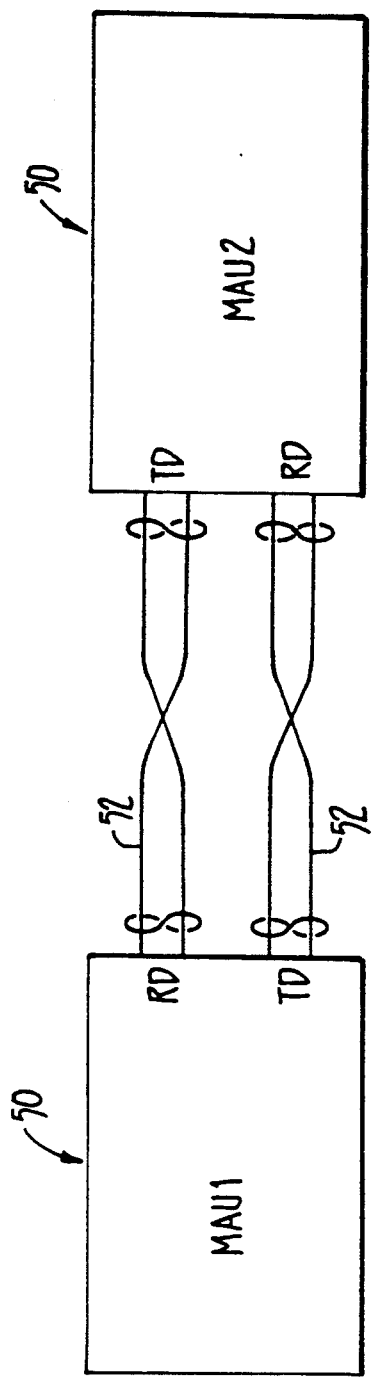
FIG. 5.
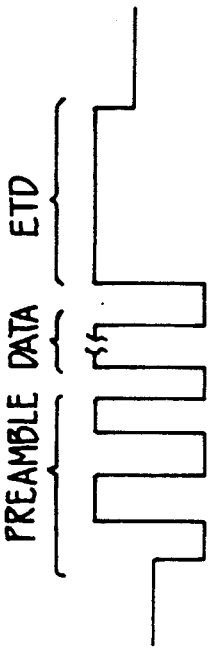
FIG. 6A.
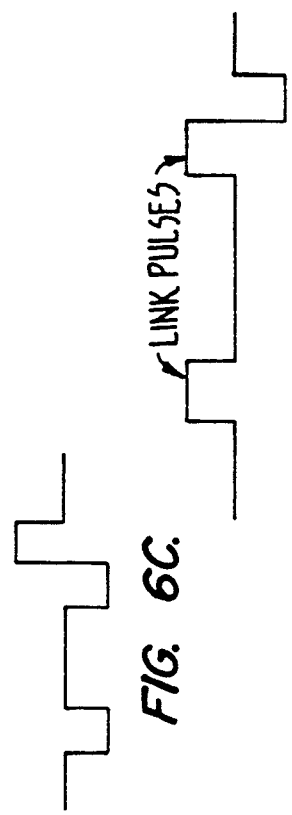
FIG. 6B.
FIG. 6C.

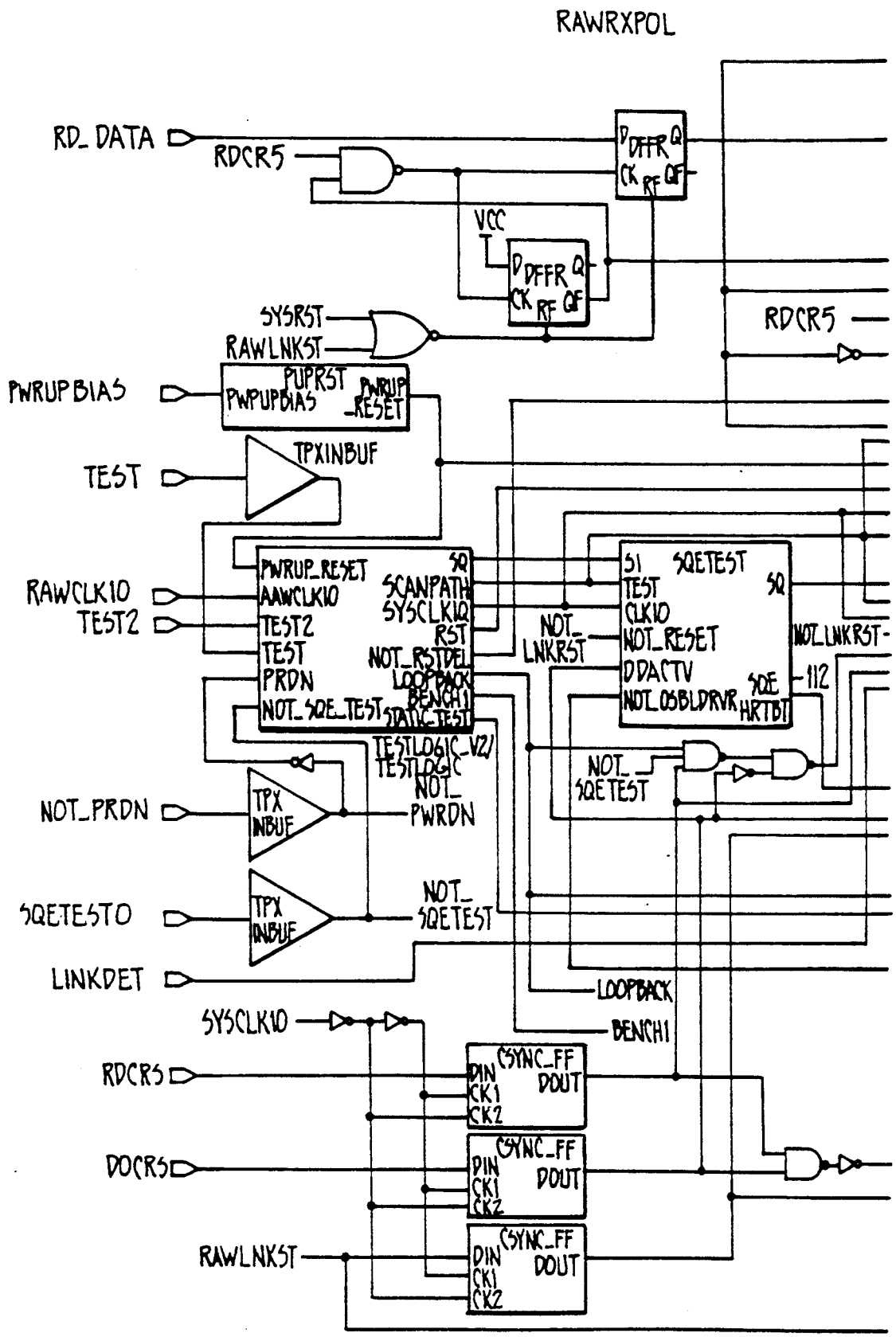
FIG._7A.

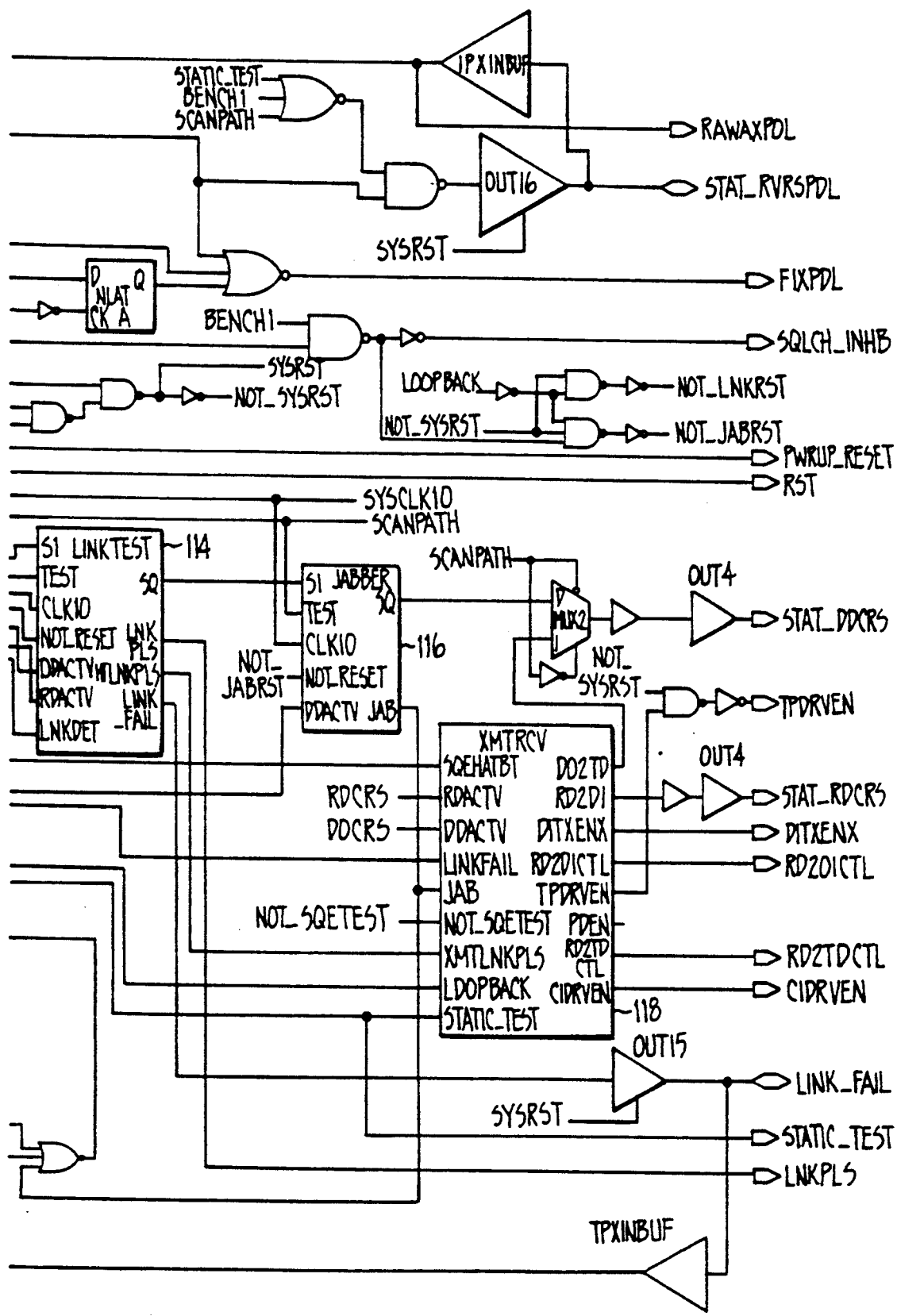
FIG._7B.

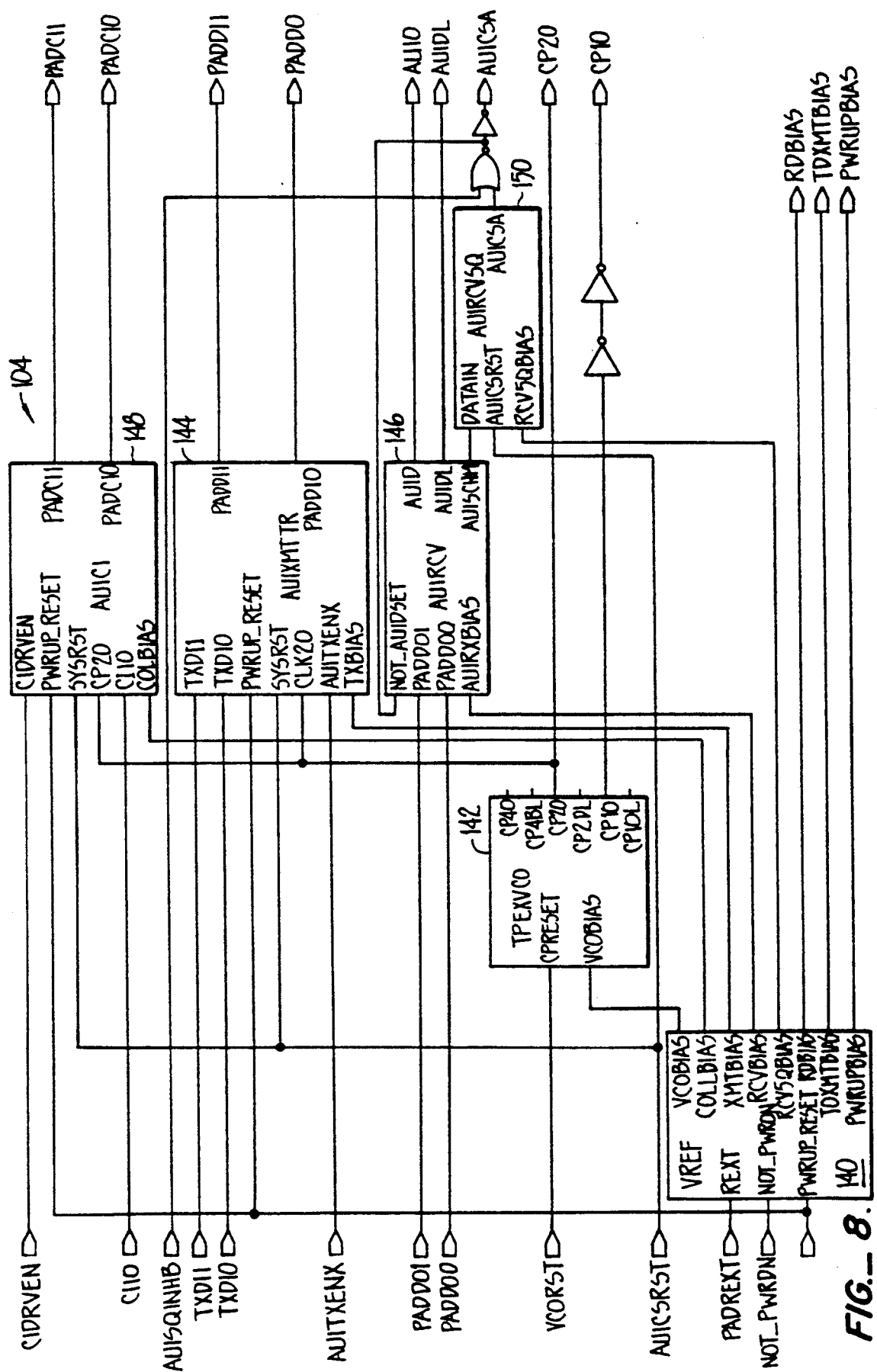
FIG._8.

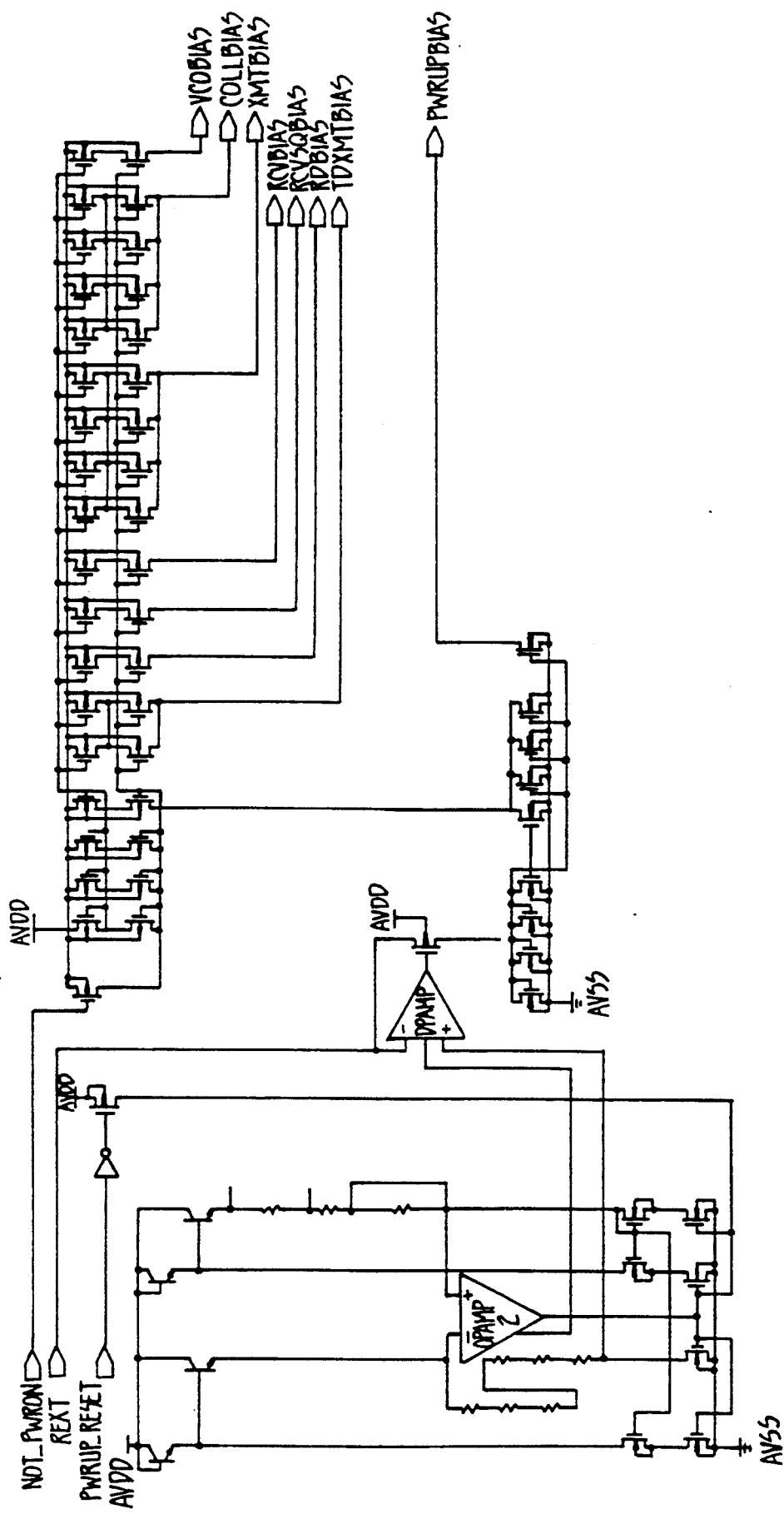
FIG._9.

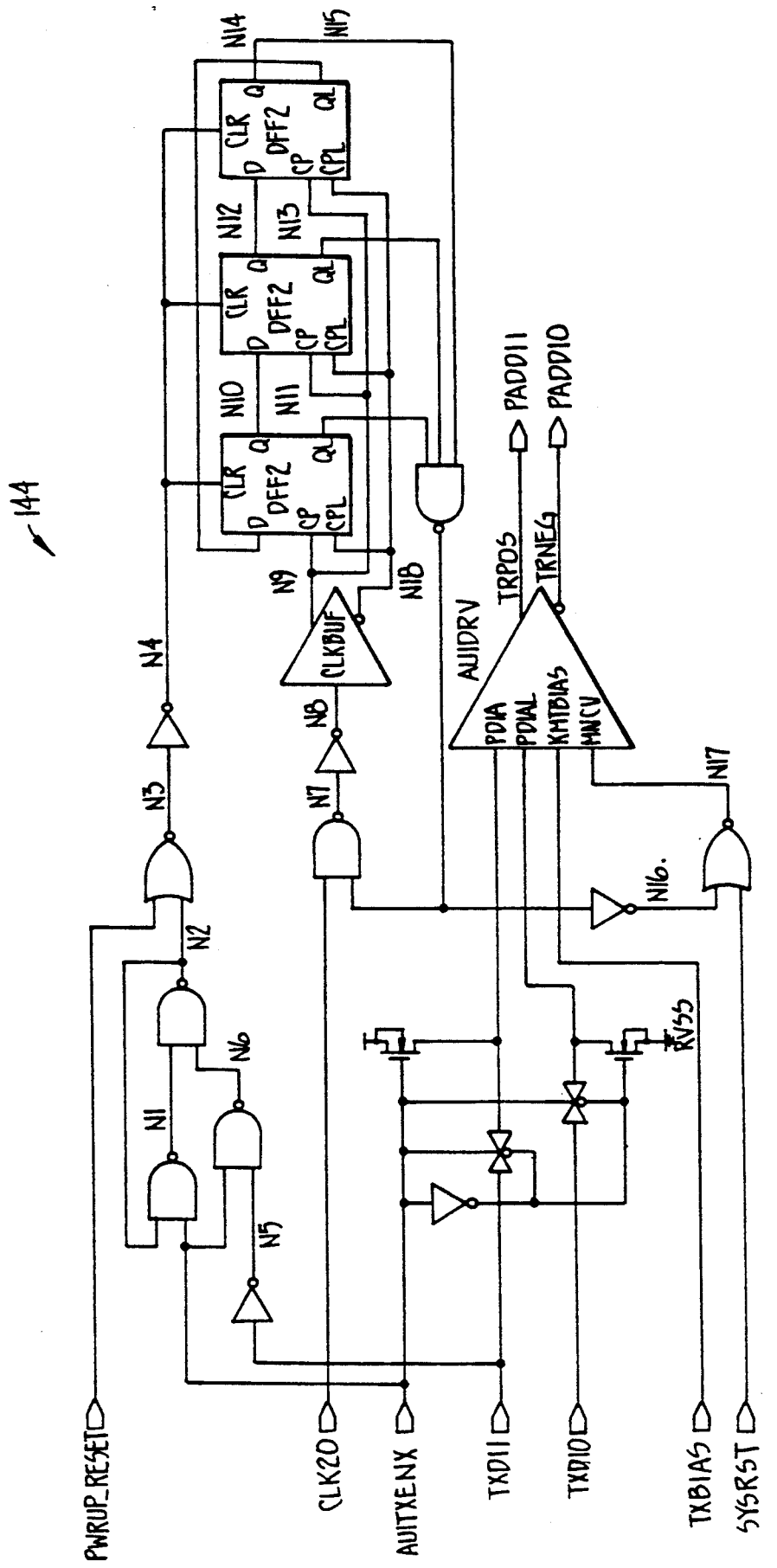
FIG._10.

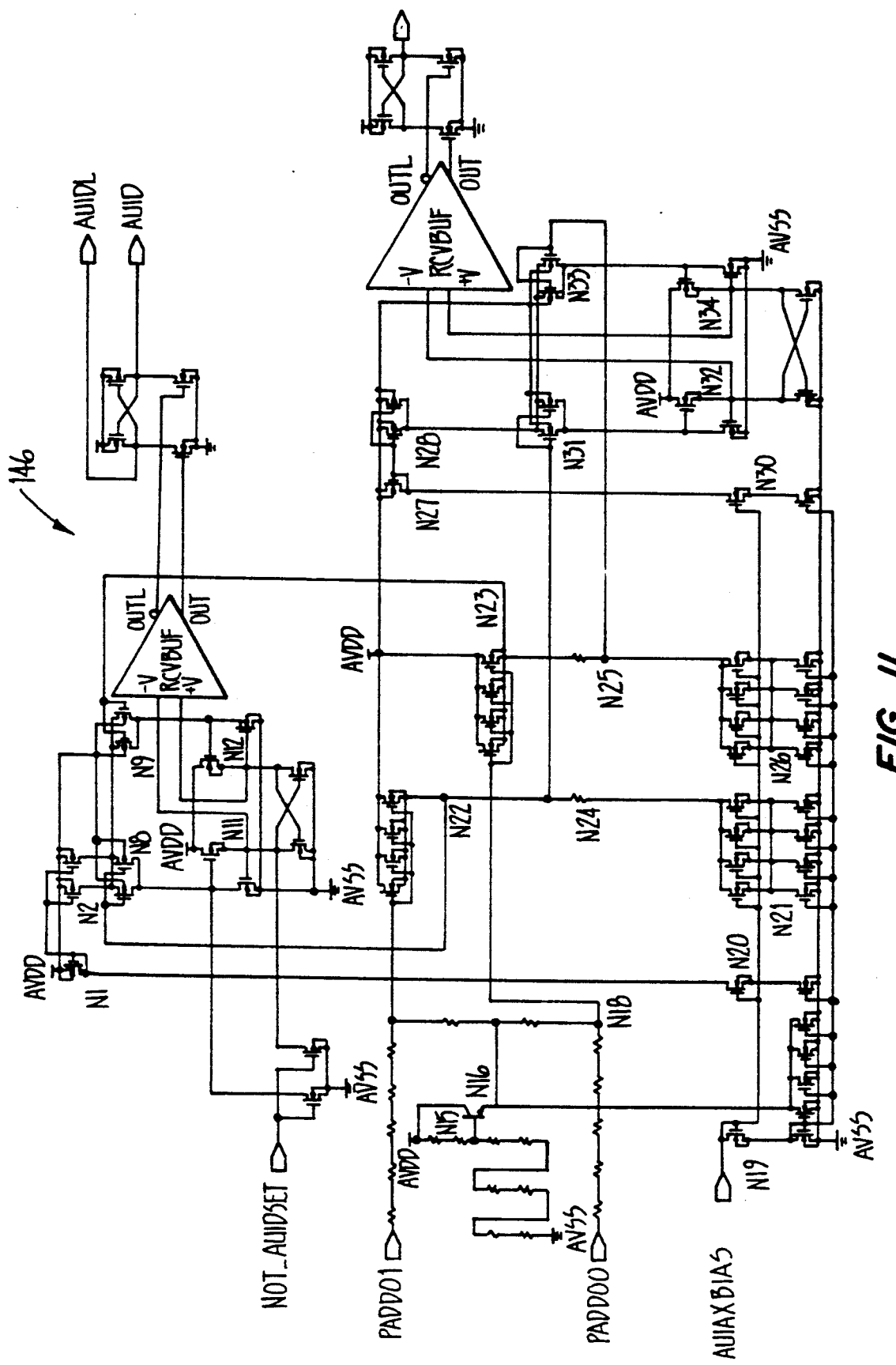
FIG._11.

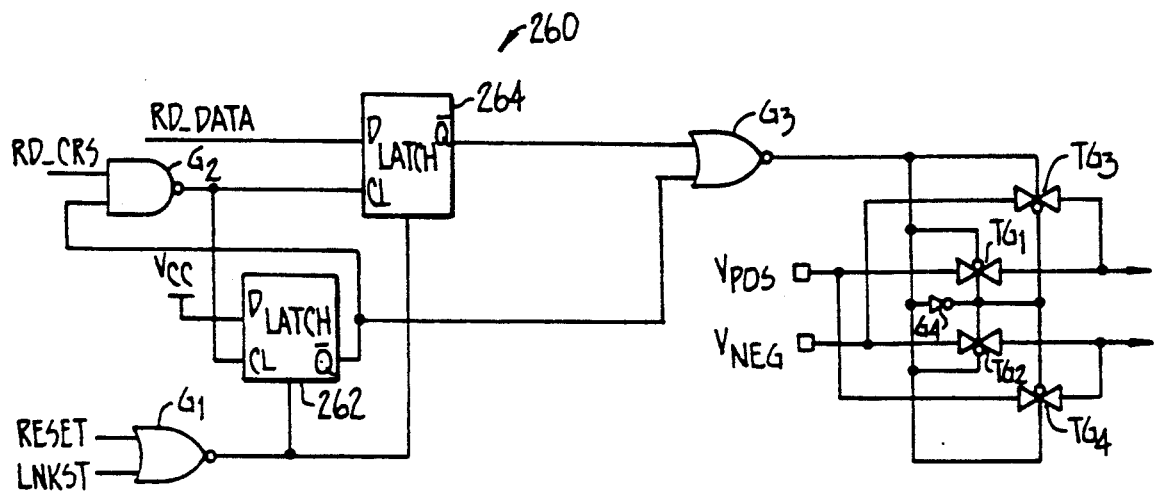
FIG.—12.
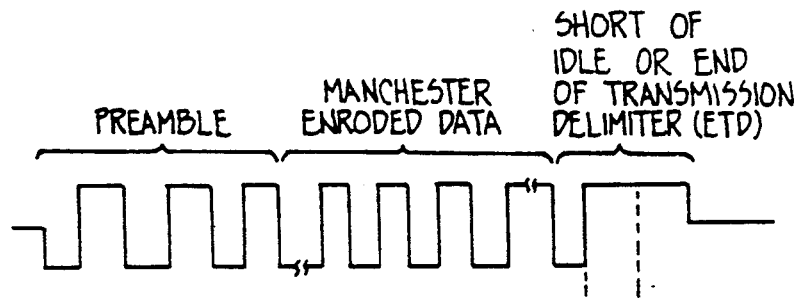
FIG.—13A.
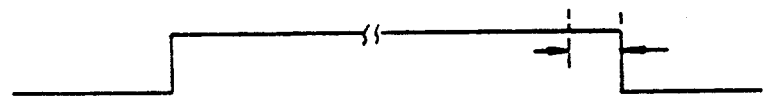
FIG.—13B.
FIG.—13C.

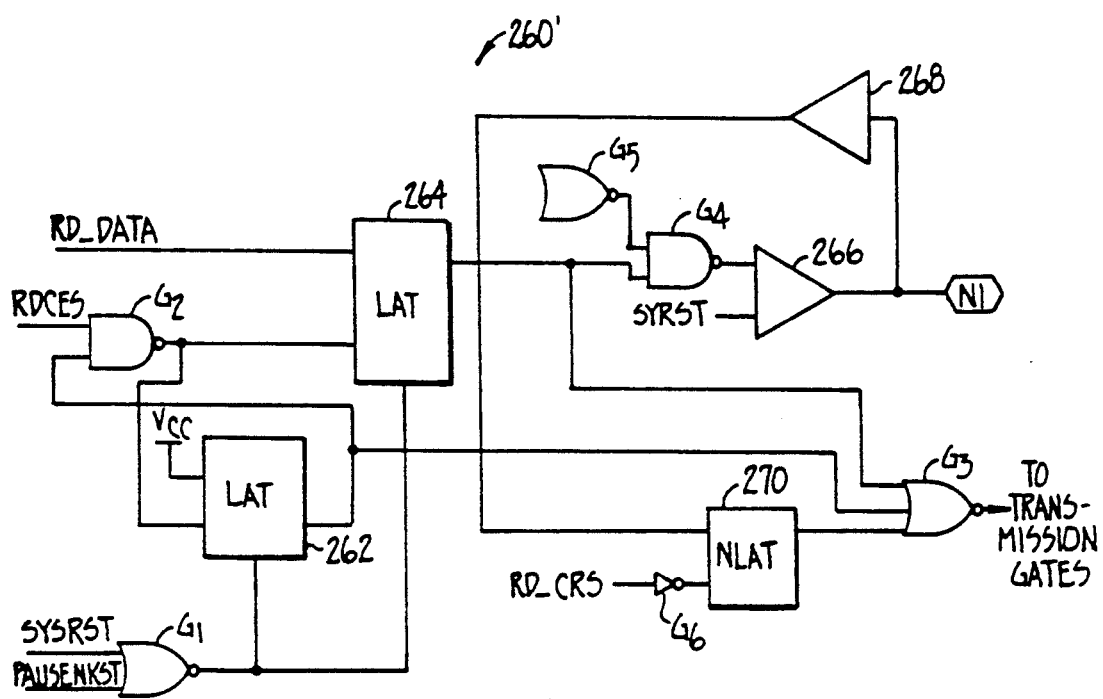
FIG._14.
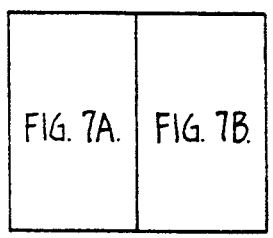
FIG._7.
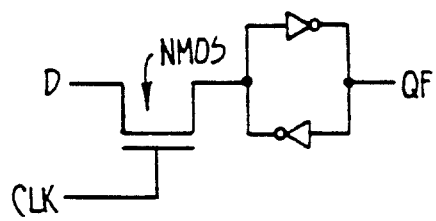
FIG._16.
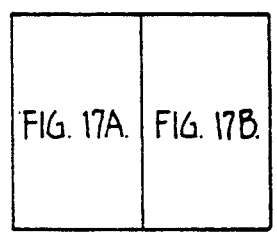
FIG. 17.
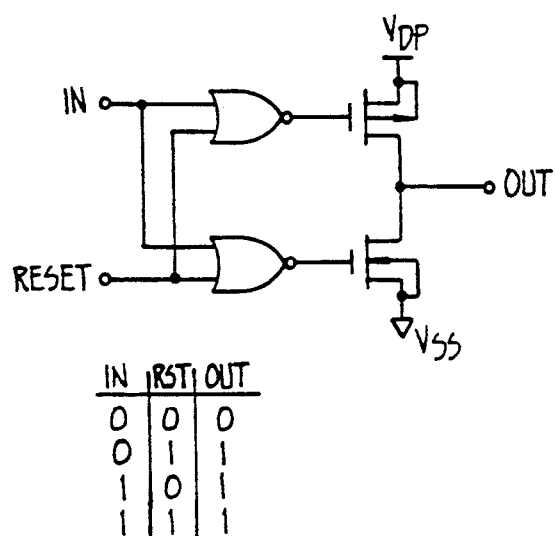
FIG._15.

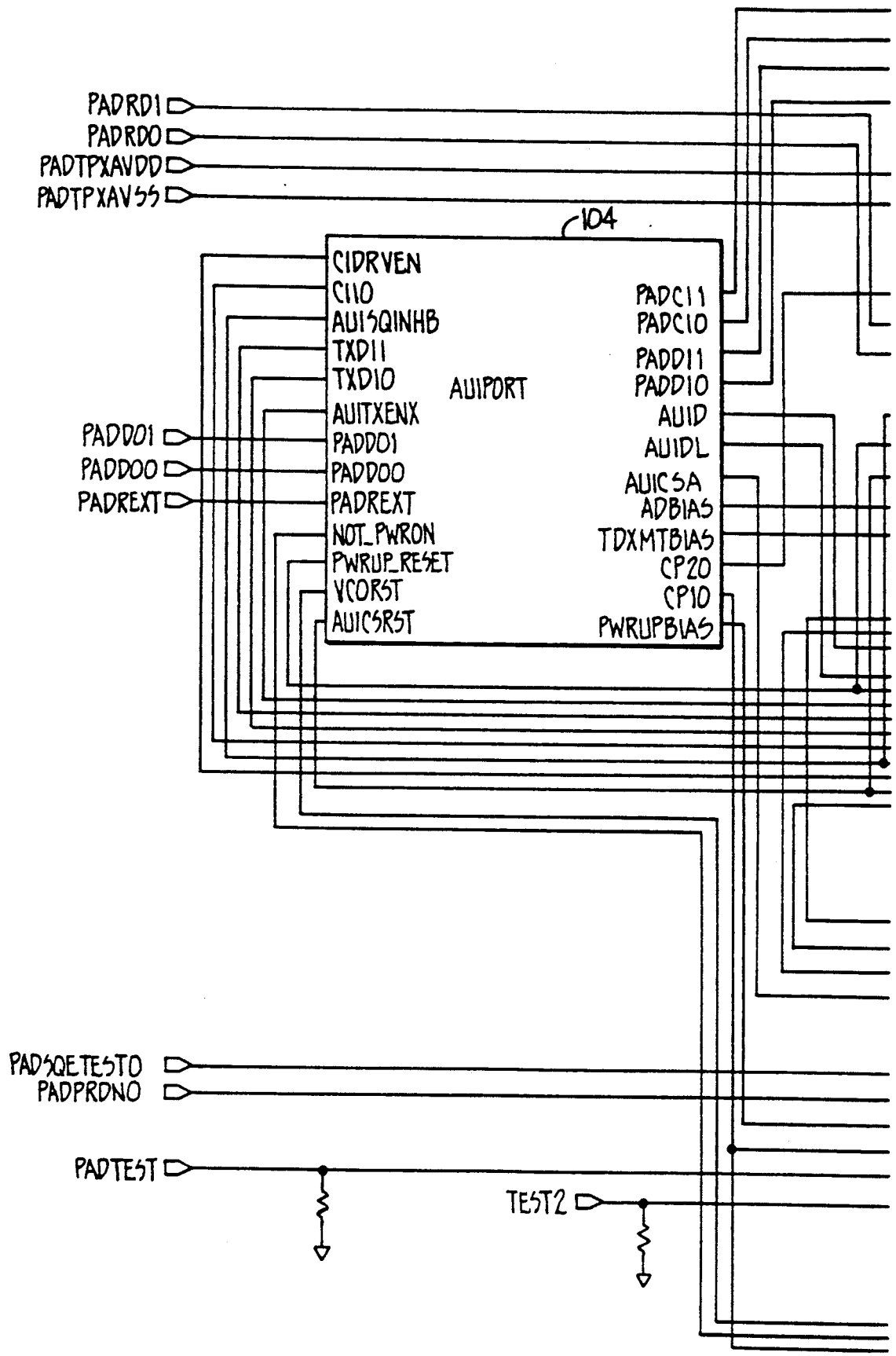
FIG._17A.

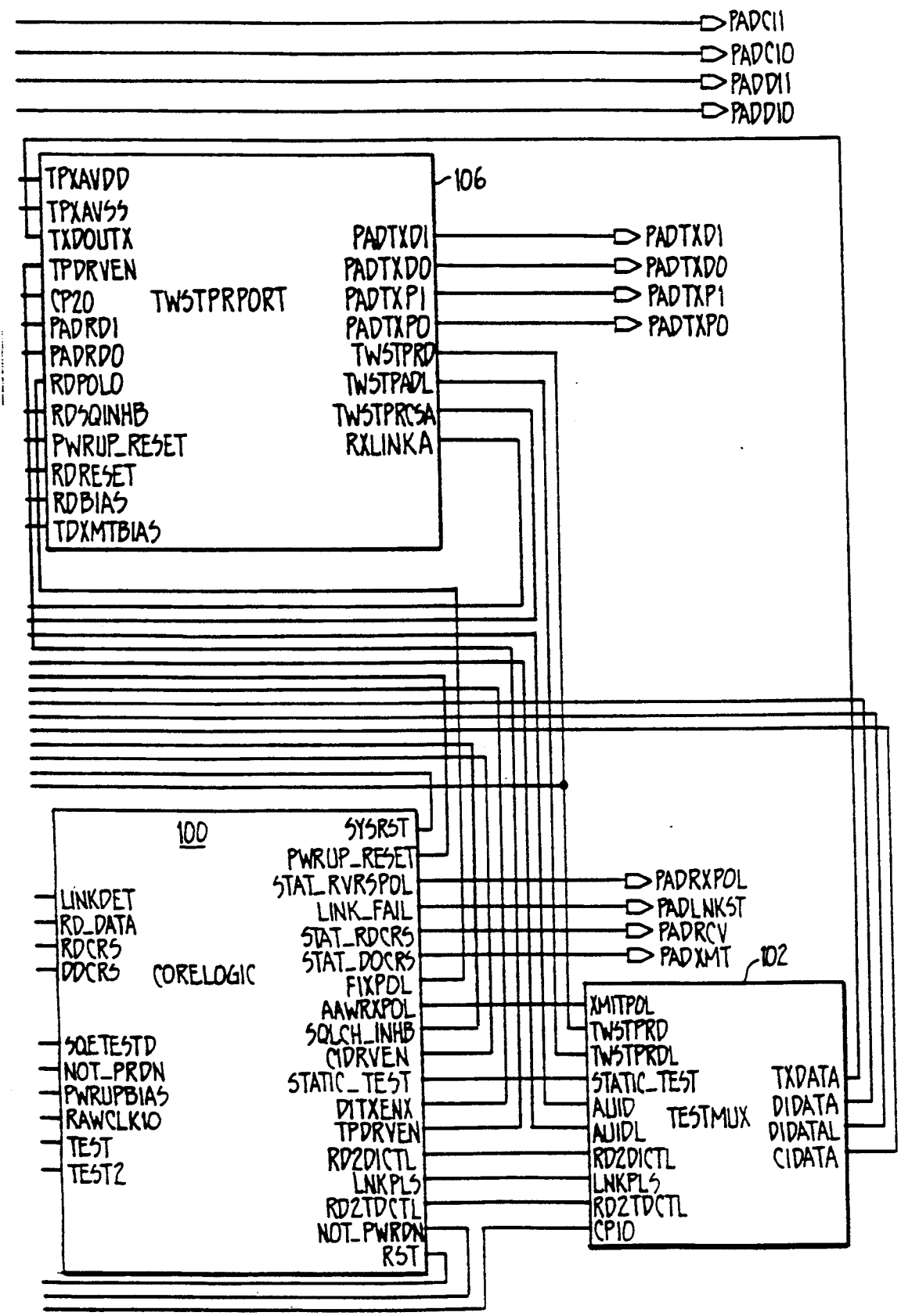
FIG._17B.

AUTOMATIC POLARITY DETECTION AND CORRECTION METHOD AND APPARATUS EMPLOYING LINKPULSES

This application is a continuation-in-part of application Ser. No. 07/480,426, filed Feb. 15, 1990, U.S. Pat. No. 5,164,960 entitled "Twisted Pair Medium Access Unit, " and hereby incorporated by reference for all purposes.

BACKGROUND OF THE INVENTION

The present invention relates to an improved apparatus and method for polarity detection and automatic reversal of an incorrect polarity for a differential receiver. The incorporated patent application provides for one embodiment of an automatic polarity detection and reversal apparatus and method. The present invention improves upon the previous invention to provide an apparatus which is useful in both a heavily loaded and a lightly loaded network. Loading of a network in this case refers to an amount of data transmitted over the network. Thus, a lightly loaded network is a network which has relatively few data transmissions.

FIG. 5 is a block diagram having two Medium Attachment Units (MAUs) 50 interconnected by a pair of twisted pair cables 52 to form a simple network. The twisted pair cables 52 transmit data packets and linkbeat pulses from one MAU 50 to the other according to the IEEE 802.3 10BASE-T standard, which is expressly incorporated by reference for all purposes. The standard requires that when one MAU 50 is not transmitting a data packet to another MAU 50, it should periodically transmit linkpulses to the MAU 50 to test an integrity of a link between the MAUs 50. FIG. 6A illustrates one example of one such packet having a preamble portion, a data portion and an end of transmission delimiter (ETD) portion. The preamble portion is an alternating series of high and low transitions and the ETD is a high level for a specified minimum time duration. FIG. 6B is an illustration of two acceptable linkpulse transmit waveforms conforming to the IEEE Specification. A linkpulse waveform is either a high transition or a high transition followed by a low transition fitting within a specified pulse template. A linktest state machine which performs the link integrity test functions described in the IEEE 802.3 10BASE-T specification monitors these link pulses to determine whether any link between two particular MAUs 50 passes a link integrity test. Upon power up or RESET, a particular MAU resets to a particular known state, either a link_pass state or link fail state. If there is no packet information received, the MAU 50 will expect to periodically receive a series of linkpulses, just as it periodically transmits a linkpulse in the absence of other transmissions. A MAU can be designed to recognize positiveonly or any polarity of link pulses. An advantage of recognizing only one polarity of link pulse at a time is that it is less likely that noise spikes will be recognized as link pulses. If a MAU 50 is designed to recognize only positive pulses, it must receive link pulses similar to those shown in FIG. 6B to enter or remain in the link_pass state. If the MAU 50 does not receive positive linkpulses within the time windows, the IEEE Specification requires, then the MAU 50 will transition to a link_fail state. The link_fail state can result from a faulty link, a disconnected lead disabled driver at transmitter reversed leads or other electrical or mechanical fault of the twisted pair cable 52 on its receive data (RD) lines. A reversed twisted pair cable 52 causes a differential receiver to receive an inverted differential signal, meaning that the linkpulses will appear inverted. FIG. 6C is an illustration of an inverted linkpulse signal which results from incorrect connection of the twisted pair cable 52.

A typical MAU 50 which recognizes positive linkpulses only and receiving an inverted linkpulse as shown in FIG. 6C will ignore the linkpulse, causing the MAU either to transition to the link_fail state, or to remain in the link_fail state. The MAUs 50 may also exit a link_fail state by receiving a data packet. The parent application allows a MAU 50 receiving valid data packets to detect reversed polarity at its RD input and to automatically correct it. However, this method requires receipt of a prespecified number of valid and consistent packets by the MAU 50. If the network is lightly loaded, the MAUs 50 will not receive enough data packets to keep the MAUs 50 from relying on linkpulses to test its link.

A potential difficulty with this prior apparatus and method results from a configuration similar to that of FIG. 5 in which both MAUs 50 have incorrectly wired twisted pair cables 52 for their RD inputs. If both MAUs 50 only look for a linkpulse with an initially positive transition, and the MAU 50 powers up in the link_fail state, then the two MAUs 50 will continually receive inverted linkpulses from each other. These inverted linkpulses will not bring the MAUs 50 out from the link_fail state. When the MAUs 50 are in the link_fail state, the linktest state machine disables output drivers of the MAUs 50, preventing the MAUs 50 from transmitting data packets. Since the prior apparatus and method relied exclusively on packet information to detect and correct polarity, the MAUs 50 of FIG. 5 would be unable to detect the incorrect polarity and correct themselves. In other words, the MAUs 50 would be locked-out and not function to correct polarity. Note that for a lightly-loaded network, a MAU 50 which powers up in a link_pass state would inevitably enter the link_fail state and be locked-out as well.

Therefore, it is a desire to improve upon the prior apparatus and method to provide an improved and robust polarity detection and correction which is operable for the network of FIG. 5.

SUMMARY OF THE INVENTION

The present invention provides method and apparatus for detecting and automatically correcting a reversed polarity of a pair of differential input lines. The invention offers advantages over existing methods and apparatus as it makes use of periodic linkpulses received as part of a link integrity test to enhance a MAU's ability to detect and correct improper data polarity.

According to one aspect of the invention, it comprises a differential receiver which receives both linkpulses and Manchester-encoded data. The parent application incorporated herein by reference discloses a method and apparatus to check an incoming signal for various attributes of a prespecified format for the incoming signal. In that patent application, the incoming signal was a Manchester-encoded signal that had a preamble portion and terminated in an end-of-transmission delimiter (ETD) having a positive voltage level. This ETD is referred to as the start of TD-IDL waveform in the IEEE 802.3 10BASE-T specification. The disclosed apparatus tests an input signal's preamble transition sequence to establish whether a Manchester packet is present at an input. If the signal is present, the differential receiver asserts an internal carrier sense signal and upon detecting the ETD or end of signal activity, it deasserts the internal carrier sense signal. The falling edge of the internal carrier sense signal causes a sampling of the ETD to establish the existing polarity. The ETD has particular characteristics, namely that it must remain positive for an extended time period at the end of transmission. Detecting this particular characteristic as a positive input results in the system determining that the input polarity is correct. However, if the ETD appears negative when the internal carrier sense is deasserted, the system determines that the input polarity is incorrect. A signal is available which remedies the incorrect polarity. The preferred embodiment reroutes the input signals applied to the RD inputs to alternate paths internally so that the differential receiver has a correct polarity for the input lines, just as if the external lines themselves had been corrected.

The present invention improves upon the present invention by recognizing whether a valid ETD is present when carrier is deasserted. In the parent invention, no voltage squelch criteria was used to determine if a carrier was deasserted due to a normal end of transmission delimeter or was caused by an abnormal end. The present invention checks for a valid ETD before using the ETD for polarity information.

The present invention improves upon this further by also monitoring input signals to sample incoming linkpulses. If the applied external signal is inverted, the linkpulses will also appear inverted. Thus, by assuming that input pulses which meet linkpulse width requirements are in fact linkpulses and making initial polarity determinations based upon this assumption, a MAU is enabled to transition to a link_pass state based upon what would otherwise be inverted, and therefore unusable, linkpulses. In the link_pass state, the MAU's output line drivers are enabled, allowing transmission of data. The polarity detection circuit uses the initial link polarity as an estimate of the polarity status when no data polarity information is available. Data polarity refers to polarity determinations based on the ETD and the internal carrier sense, in the preferred embodiment. Thus, MAUs wired as in FIG. 5 with reversed input lines are not caused to be locked-out, and data transmissions may resume between the Data Terminal Equipment (DTE) and the network. The polarity circuit will use the transmitted and ETD polarity information to determine arbitrate a final decision of an appropriate polarity for the system, as the transmitted ETD information is more easily distinguishable from noise than are linkpulses. Therefore, the ETD polarity information supersedes linkpulse polarity information. In the preferred embodiment, when the data polarity information determines that a sufficient number of successive consistent data packets have been received, the system locksout further polarity changes until a system reset or the system enters a link_fail state. The system may include an optional provision for disabling the polarity reversal as described in the incorporated parent patent application.

The present invention is superior to existing systems because it incorporates linkpulse information to establish an initial polarity, thus allowing a system to pass a link integrity test so that it can transmit data to another MAU, which can, in turn, use the transmitted data to make a final polarity determination. This is especially useful in lightly loaded networks and in those otherwise active networks where no data transmission occurs at infrequent intervals.

Reference to the remaining portions of the specification and the drawings realizes a further understanding of the nature and advantages of the invention.

BRIEF DESCRIPTION OF THE DRAWINGS

FIG. 4A is a logic table illustrating the relationship of the NOR gate G100 inputs and the output selected by the multiplexer 102;

FIG. 5 is a block diagram having two Medium Attachment Units (MAUs) 10 interconnected by a pair of twisted pair cables 12 to form a simple network;

FIG. 6A illustrates one example of a packet having a preamble portion, a data portion and an end of transmission delimeter (ETD) portion;

FIG. 6B is an illustration of two acceptable linkpulse waveforms conforming to the IEEE specification;

FIG. 6C is an illustration of an inverted linkpulse signal which results from incorrect connection of the twisted pair cable;

FIG. 7 is a diagram illustrating the combination of FIGS. 7A and 7B to produce a single drawing;

FIGS. 7A and 7B are a functional block diagram further illustrating features of CORELOGIC 100;

FIG. 8 through FIG. 11 are block schematic diagrams of AUIPORT 104 of FIG. 17 illustrating implementation of the isolation impedance presented to AUI 30 during idle mode;

FIG. 8 is a block schematic diagram of AUIPORT 104 showing its functional subunits;

FIG. 9 is a circuit schematic diagram of VREF circuit 140 which supplies power to the circuits of AUIPORT 104;

FIG. 10 is a schematic diagram of AUIXMTR circuit 144;

FIG. 11 is a schematic diagram of AUIRCV circuit 146;

FIG. 12 is a schematic diagram of a subnetwork of FIG. 7 for reversing polarity of two signals, Vpos and Vneg if necessary;

FIGS. 13A-13C illustrate a plurality of waveforms which are relevant to a discussion of an preferred embodiment of an aspect of the present invention relating to polarity reversal;

FIG. 14 is a schematic block diagram illustrating a preferred implementation of a polarity sensing circuit 260' which will permit polarity reversal to be inhibited by a user. When inhibiting polarity reversal, node N1 is coupled to a ground voltage.

FIG. 15 is a schematic circuit diagram of a preferred embodiment for buffer 266, as well as a truth table illustrating its operation;

FIG. 16 is a schematic diagram of NMOS latch 270;

FIG. 17 is a diagram illustrating the combination of FIGS. 17A and 17B to produce a single drawing; and FIGS. 17A and 17B are block diagrams of integrated circuit 52 including a CORELOGIC circuit 100, a TESTMUX circuit 102, an AUIPORT circuit 104 and a TWSTPRPORT circuit 106.

DESCRIPTION OF A SPECIFIC EMBODIMENT

Figure 1:
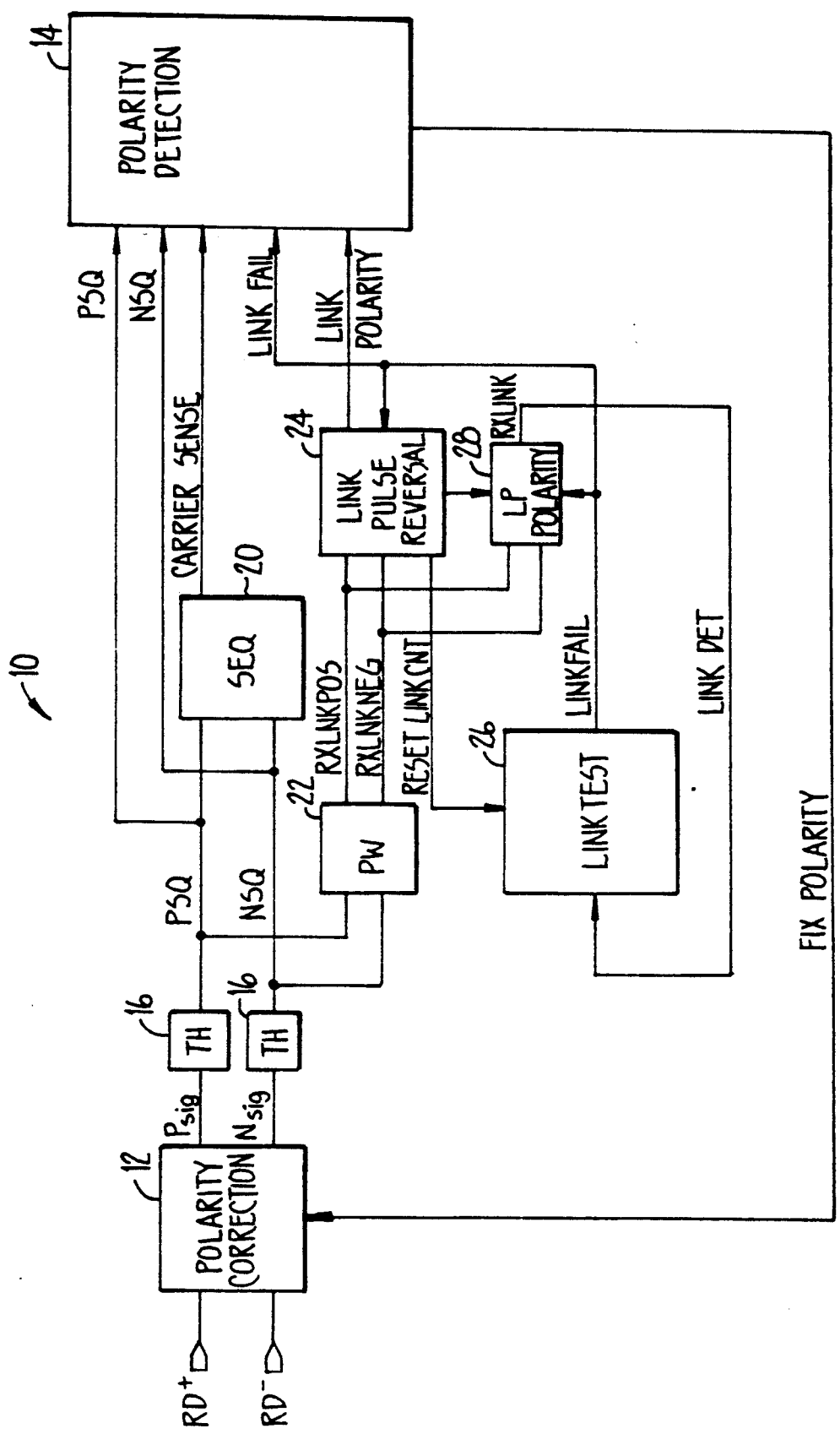
FIG. 1 is a block schematic diagram of a preferred embodiment of the present invention.

FIG. 1 is a block schematic diagram of a preferred embodiment of the present invention. FIG. 1 includes a portion of a differential receiver 10 having two input lines RD+ and RD− incorporating an automatic polarity detection and correction circuit of the present invention. A polarity correction circuit 12 receives any input signals from the RD+ and the RD− input lines. The polarity correction circuit 12 remedies an incorrect polarity of the RD+ and the RD− input lines in response to a FIX POLARITY signal from a data polarity detection circuit 14. In the preferred embodiment of the present invention, the polarity correction circuit 12 responds to an assertion of the FIX POLARITY signal to internally reroute an RD+signal to a Nsig output. Similarly, the polarity correction circuit reroutes an RD− signal to a Psig output. Ordinarily, without an assertion of the FIX POLARITY signal, an RD+ signal and an RD− signal would propagate to the Psig and the Nsig outputs, respectively. As discussed in the parent application, the correction circuit 12 could invert input signals upon an assertion of the FIX POLARITY signal to correct the incorrect polarity. A pair of threshold evaluating circuits 16 are attached to the polarity correction circuit 12 outputs, one to the Psig line and one to the Nsig line. A well-known comparator circuit operates for each of the threshold evaluating circuits 16 to provide amplitude qualification for input signals. Any input signal below a prespecified threshold voltage does not propagate past the evaluating circuits 16. These circuits 16 remove low level noise from the internal signal lines. Any input signal at Psig which exceeds the threshold voltage will propagate to a positive squelch line (PSQ) while Nsig signals exceeding the threshold voltage will propagate to a negative squelch line (NSQ).

A transition sequence checking (SEQ) circuit 20 and a pulse width qualifying circuit (PW) 22 receive any PSQ and NSQ signals. The SEQ circuit 20 operates similarly to a transition sequence checking circuit described in the parent application to determine if a signal on the PSQ and the NSQ lines is a Manchester-encoded signal having a valid end-of-transmission (ETD) delimiter. If the SEQ circuit 20 detects a proper transition sequence, the SEQ circuit 20 asserts a carrier sense signal until transitions cease, as during the ETD. Lack of transitions at PSQ and NSQ cause the SEQ circuit 20 to deassert the carrier sense signal. Additionally, the PW 22 samples any PSQ and NSQ signals to determine if the signals might represent linkpulses rather than encoded data. Transmitted linkpulses have a particular waveform with a pulse width within a prespecified range. Pulses which are too narrow or too wide cannot be linkpulses and are rejected by the PW 22. Pulses with too many transitions are likewise rejected by PW 22. A reversal of the RD+ and the RD− input lines also inverts the linkpulses. Therefore, "upside-down" linkpulses can give an indication of incorrect polarity in their own right, in addition to the data packets. The preferred embodiment uses the ETD polarity when it is available in that the linkpulse polarity method is more susceptible to noise and therefore susceptible to erroneous indications of correct and reversed polarities.

The PW 22 provides two output signals in response to assertions of a PSQ and an NSQ signal; receive link positive (RXLNKPOS) and receive link negative (RXLNKNEG). An assertion of PSQ for a duration falling within the established pulse width range will fire a one-shot circuit to assert a RXLNKPOS signal. Similarly, a desired pulsewidth on the NSQ signal will assert a RXLNKNEG signal. A link pulse reversal circuit 24 monitors assertions of both RXLNKPOS and RXLNKNEG to determine an initial polarity sense for the RD+ and the RD− input lines. For received linkpulses falling within an IEEE 10BASE-T standard, a PSQ assertion or a PSQ assertion followed by an NSQ assertion is a proper linkpulse sequence which asserts RXLNKPOS and is likely to be a link pulse. Therefore, an assertion of NSQ or an assertion of NSQ followed by PSQ may indicate that the RD+ and the RD− lines have a reversed polarity as the PW 22 asserts its RXLNKNEG signal. Thus, the link pulse reversal circuit 24 monitors for a series of successive consistent linkpulses and makes preliminary determinations of an RD+ and RD− polarity based solely upon the linkpulse information. The link pulse reversal circuit 24 asserts a link polarity signal if RXLNKPOS and RXLNKNEG assertions indicate that the RD lines have an incorrect polarity.

The link pulse reversal circuit 24 monitors and changes polarity only when the differential receiver 10 is in its link_fail state as determined by a linktest state machine 26. The link test state machine 26 of the preferred embodiment implements a link integrity test according to an IEEE 802.3 Specification hereby expressly incorporated by reference for all purposes. This link integrity test specifies that a MAU incorporating the differential receiver 10 must receive a minimum number of linkpulses with the proper amount of delay between pulses before its linktest state machine 26 transitions it to a link_pass state. Alternatively, receipt of a valid data packet allows the linktest state machine 26 to transition to the link_pass state. Reversal of the RD+ and the RD− lines would prevent the linktest state machine 26 from ever entering the link_pass state in an absence of data packets if only positive linkpulses are accepted by the MAU. The linktest state machine 26 of the preferred embodiment enters the link_fail state upon power up or reset.

To allow the linktest state machine 26 to operate properly with inverted linkpulses, a linkpulse polarity circuit 28 is responsive to a polarity signal from the link pulse reversal circuit 24 to route either the RXLNKPOS or the RXLNKNEG pulses to the linktest state machine 26, as appropriate. Additionally, as the linktest state machine 26 requires a particular number of consecutive linkpulses before it may transition to the link_pass state, when the link pulse reversal circuit 24 alters a particular polarity of the linkpulses, it asserts a signal to the linktest state machine 26 requiring the linktest state machine 26 to reset its consecutive linkpulse counter. In this fashion, only consecutive link pulses of like polarity will allow the linktest state machine 26 to transition to the link_pass state. Upon transitioning through a link_fail extend state to the link_pass state as described in the IEEE 802.3 10BASE-T standard, the linktest state machine 26 deasserts a linkfail signal which it asserts as long as it is in the link_fail state. The polarity detection circuit 14 and the link pulse reversal circuit 24 receive and respond to various states of the linkfail signal. Deassertion of the linkfail signal disables the link pulse reversal circuit 24 from further effecting a state of the link polarity signal and the particular one of the RXLNKPOS and RXLNKNEG signals directed to the linktest state machine 26. This disabling remains in effect until a reset occurs or the linktest state machine returns to the link_fail state, such as would occur, if for example, the polarity was locked-in incorrectly and the network had a period of light traffic, allowing the link integrity test to fail. The reader will note that a frequent exchange of data packets prevents transmissions of linkpulses.

The polarity detection circuit 14 responds to various assertions of the PSQ, NSQ, carrier sense, link polarity and the linkfail signals to assert or deassert the FIX POLARITY signal to the polarity correction circuit 12. An initial determination of a state for the FIX POLARITY signal results from a status of the link polarity signal at a time when the linktest state machine 26 transitions to the link_pass state. Deassertion of linkfail simultaneously locks-in a state of the link polarity signal as well as influences the FIX POLARITY signal to initially have the same value as the link polarity signal. A detailed description of the specific operation of the polarity detection circuit 14 and the link pulse reversal circuit 24 follows the present description of the overall system.

The initial polarity determination based on the link pulse information will not become final until polarity determinations based on received data verify the initial determination. The ETD polarity determinations are an improvement to the apparatus and method described in the parent application incorporated herein. An assertion of PSQ or NSQ when the SEQ 20 deasserts carrier sense signal determines whether the polarity detection circuit 14 verifies a correctness of any particular established polarity. That is, an assertion of PSQ upon a deassertion of the carrier sense indicates that the presently established value of the FIX POLARITY signal is correct. In contrast, an assertion of NSQ upon a deassertion of the carrier sense changes a state of the FIX POLARITY signal, irrespective of its initial value established by the link polarity signal. The next valid ETD will test the previous determinations of polarity in the same fashion, either accepting or reversing the state of the FIX POLARITY signal. The polarity detection circuit 14 will continue to upgrade its last evaluation of the polarity status of the RD+ and the RD— lines until it counts a prespecified number of successive consistent determinations of a particular state for the FIX POLARITY signal. The polarity detection circuit 14 ignores invalid data packets and does not count them in any particular series. The invalid data packet, known as a packet fragment, does not include a valid ETD or otherwise include an ETD that is corrupted by noise. The preferred embodiment of the present invention requires two successive consistent polarity determinations. Counting two successive consistent valid pulses will lock-in the current state of the FIX POLARITY signal. Changing the state of the FIX POLARITY signal is possible thereafter only after reset or assertion of the linkfail signal, in the preferred embodiment.

The term "consistent" conveys the concept that a second pulse (PSQ or NSQ) following a first pulse asserts a signal when it is consistent with a then present assumption made for a particular state of the input lines RD+ and RD—. In other words, if a first pulse does not appear inverted, an inverted subsequent pulse would not be consistent with the first determination that the input lines had the proper polarity. Similarly, an inverted first pulse would indicate polarity reversal, resulting in remedying the incorrect polarity. To be consistent with this determination, a second pulse must now appear non-inverted. A second pulse which was also inverted would not be consistent with the determination made based upon the first pulse. The present invention's focus upon the detection of polarity reversal for Manchester-encoded differential signals having a positive voltage level for the ETD ultimately means that consistency can only be obtained by having all pulses after an initial determination assert only PSQ upon a carrier sense signal deassertion. Any other combination would be inconsistent, preventing the polarity detection circuit 14 from locking-in a state for the FIX POLARITY signal. It is important that the polarity detection circuit 14 wait for the prespecified number of consistent pulses as noise can remain for an indefinite duration on the RD input lines after "plugging in" a MAU to the network, resulting in uncertain polarity determinations.

In operation, the differential receiver 10 effectively and simply provides for automatic polarity detection and correction. There are many combinations and permutations of the different states of many key parameters for the system, so only a representative example of the operation of the system will be provided. Initially, the linktest state machine 26 is in a link$_{13}$ fail state, requiring receipt of a minimum number of linkpulses or a data packet before enabling output drivers of a MAU incorporating the differential receiver 10.

A first scenario has the MAU wired properly. The receiver 10 will receive linkpulses or a full or partial data packet. Receipt of a first linkpulse asserts RXLNKPOS and PSQ without a carrier sense assertion. This is the expected sense for the linkpulse signal, and results in a deassertion of link polarity and a routing of RXLNKPOS to the linktest state machine 26 for counting. If the minimum consecutive number of linkpulses occur in the same fashion, then the linktest state machine will deassert linkfail as it transitions to the link_pass state, locking-in the deasserted value of link polarity signal to the polarity detection circuit 14. Thereafter, the first Manchester-encoded signal having a valid ETD will assert PSQ when the carrier sense is deasserted because the ETD remains at a high level for an extended period. The polarity detection circuit 14 logs the occurrence of a valid ETD and does not change the value of the FIX POLARITY signal. The next valid data signal will confirm the value of the FIX POLARITY signal because a PSQ assertion corresponding to a carrier sense deassertion is a consistent result, and locks-in the value of the FIX POLARITY signal until a reset or a linkfail condition occurs.

The second scenario is similar to the first, except for a reversal of the RD lines. In this instance, the linkpulse signals result in an assertion of the RXLNKNEG signals, indicating a reversed polarity. The link reversal circuit adjusts the polarity for the linktest state machine by routing it the RXLNKNEG signals rather than the RXLNKPOS signals. The link pulse reversal circuit 24 also asserts the link polarity signal to provide the initial indication that the polarity is reversed. When the linktest state machine 26 counts the correct number of inverted linkpulses, it transitions to the link_pass state, preventing the link pulse reversal circuit 24 from changing the link polarity signal as well as asserting the FIX POLARITY signal to match the link polarity signal. The FIX POLARITY signal remains asserted until locked-in by confirmation through use of subsequent ETD polarity information. An input data signal will now assert PSQ when the carrier sense signal is deasserted. The polarity detection circuit 14 will log the occurrence of the valid ETD and the fact of the assertion of the FIX POLARITY signal. A subsequent consistent determination, PSQ with a deassertion of the carrier sense signal, will lock-in the assertion of the FIX POLARITY signal.

The third scenario provides for noise on the RD input lines. The noise can adversely effect the linkpulses, or erroneously appear as linkpulses, as well as adversely effect any data inputs or emulate data, though the latter is the least likely. The noise will cause the link pulse reversal circuit 24 to alternatively route RXLNKPOS and RXLNKNEG to the linktest state machine 26, as well as correspondingly deasserting and asserting the link polarity signal. Whenever the link reversal circuit 24 makes a different polarity determination from its last determination, it resets the link pulse counter of the linktest state machine 26 which gives some margin of protection from noise-induced error. When the linktest state machine counts the minimum number of consecutive consistent linkpulses, it deasserts linkfail and locks-in the then present value of the link polarity signal. The initial value of the FIX POLARITY signal will match this locked-in value of the link polarity signal. The FIX POLARITY signal's final determination of polarity status for the input RD lines remains until received data confirms or refutes the link polarity initial determination. An assertion of NSQ corresponding to a deassertion of the carrier sense signal results in a reversal of the then present value of the FIX POLARITY signal. A subsequent assertion of NSQ with a carrier sense deassertion will continue to toggle the FIX POLARITY signal until a PSQ coupled with the carrier sense signal deassertion locks-in the then present value of the FIX POLARITY signal.

Figure 2:
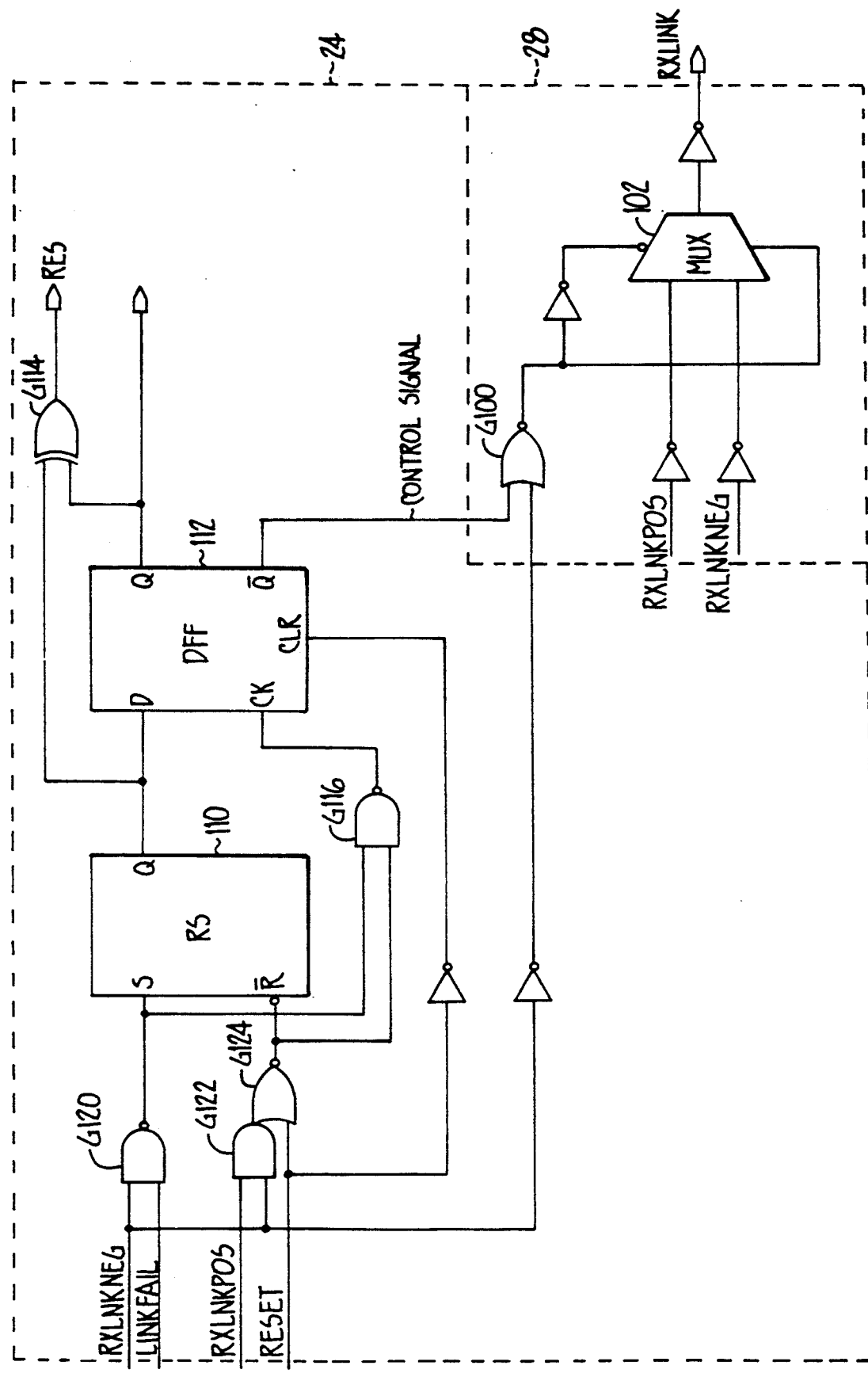
FIG. 2 is a detail block diagram of the link pulse reversal circuit 24 and the link pulse polarity circuit 28.

FIG. 2 is a detail block diagram of the link pulse reversal circuit 24 and the link pulse polarity circuit 28. The link pulse reversal circuit 24 has four input signals, RXLNKPOS, RXLNKNEG, RESET, and linkfail. The link pulse reversal circuit 24 has three output signals, the link polarity signal, the linkpulse counter reset signal (LNKCNT RESET), and a control line for the link pulse polarity circuit 28. The link pulse polarity circuit 28 has four inputs, the RXLNKPOS and RXLNKNEG signals, the Linkfail signal and the control signal from the link pulse reversal circuit 24. The link pulse polarity circuit 28 provides the RXLINK signal to the linktest state machine 26 responsive to these signals.

The link pulse polarity circuit 28 is a simple multiplexing circuit to choose a particular one of the RXLNKPOS and the RXLNKNEG signals to route to the linktest state machine 26 as the RXLINK signal which represents a linkpulse line. A two input NOR gate G100 receives the control signal from the link pulse polarity circuit 24 and the linkfail signal to control a multiplexer 102 which receives the RXLNKPOS and RXLNKNEG signals as input signals. Depending upon the output of the NOR gate G100, the multiplexer 102 will select a particular one of its input signals to route to an output as the RXLINK signal The output value of the NOR gate G100 depends upon the state of the input signals, the control signal and the linkfail signals. As further described below, the control signal value is a complementary value to the link polarity signal. Thus, when the link pulse reversal circuit 24 deasserts the link polarity signal, it asserts the control signal, and vice versa. FIG. 4A is a logic table illustrating the relationship of the NOR gate G100 inputs and the output selected by the multiplexer 102. The control signal operates to indicate a polarity determination made by the link pulse reversal circuit 24, and as such, operates to route the proper RXLNKPOS or RXLNKNEG signal to the linktest state machine 26. However, the link pulse reversal circuit 24 functions to change linkpulse polarity when the linktest state machine is in the link_fail state. As soon as the linktest state machine enters the link_pass state, the system requires that the link pulse polarity circuit 28 route the RXLNKPOS signal as the RXLINK signal. This is possible because when the linktest state machine 26 enters the link_pass state, the initial polarity of the link polarity signal will influence the correction circuit 12 to change the wiring direction as appropriate. Thus, if the link polarity signal indicates that a reversed polarity of the input signals exists when the linktest state machine deasserts the linkfail signal, the correction circuit 24 will route RD— input signals to the Psig lines, which means linkpulses on the RD— line will manifest themselves as a RXLNKPOS signal, which is correct for reversed RD input lines.

The link pulse reversal circuit 24 includes an RS latch 110 having an output coupled to a D flip-flop 112 data input. An output of the D flip-flop 112 provides the link polarity signal. An exclusive-or (XOR) gate G114 samples the D flip-flop 112 output and the RS latch 110 output, and if the signals are different, indicating a polarity change, then the XOR G114 asserts the LNKCNT RESET. A complementary output of the D flip-flop 112 provides the control signal to the link pulse polarity circuit 28. The reset signal clears the D flip-flop 112 and RS latch 110 outputs to a low level, that is, it deasserts the link polarity signal indicating no polarity reversal of the input lines. A low to high (positive edge triggered) transition on a clock (CK) input of the D flip-flop 112 latches a value present at the D input, the RS latch 110 output, to its output. An output of a dual-input NAND gate G116 controls the CK input of the D flip-flop 112. Qualified RXLNKPOS and the RXLNKNEG signals are input to the RS latch 110 and to the NAND gate G116.

A dual-input NAND gate G120 has the RXLNKNEG signal as one input and the linkfail signal as the other input. Similarly, a dual-input AND gate G122 has the RXLNKPOS signal as one input and the linkfail signal as the other input. A dual-input NOR gate G124 has the RESET signal as one input and an output of the AND gate G122 as the other input. The RS latch 110 has a set input and a reset input with inverted senses. That is, a deassertion of a signal on the set input will set (assert) the RS latch 110 output and a deassertion of a signal on the reset input will reset (deassert) the RS latch 110 output. An output of the NAND gate G120 provides the set input signal to the RS latch 110 and an output of the NOR gate G124 provides the reset input signal to the RS flip-flop 124. Additionally, the outputs of the NAND gate G120 and the NOR gate G124 provide the two input signals for the NAND gate G116 which controls the D flip-flop 112.

Initially, after a power up or a reset, the D flip-flop 112 deasserts the link polarity signal and the linktest state machine 26 asserts the linkfail signal. A first assertion of one of the RXLNKPOS or the RXLNKNEG signals will either reset or set the RS latch 110, respectively. An assertion of the RXLNKNEG signal will set the RS latch 110, as well as produce an assertion of the NAND gate G116 output. Asserting the NAND gate G116 outputs clocks the set value of RS flip-flop 112 to the link polarity signal output, thereby clocking in a previous value of the RS latch 110. Another assertion of either RXLNKPOS or RXLNKNEG latches an appropriate value at the RS Patch 110 output and the asserted output of the latch into the D flip-flop 112. The XOR gate G114 will assert the RESET LNKCNT signal and the deasserted control signal will route RXLNKNEG to the linktest state machine 26 as the RXLINK signal. The RXLNKPOS and the RXLNKNEG signals will continue to effect the link polarity signal, with the RXLNKPOS signal deasserting the link polarity signal and the RXLNKNEG signal asserting the link polarity signal until the linktest state machine enters the link_pass state. At which time, the assertions of the RXLNKPOS and the RXLNKNEG signals can no longer effect changes in the link polarity signal.

Figure 3:
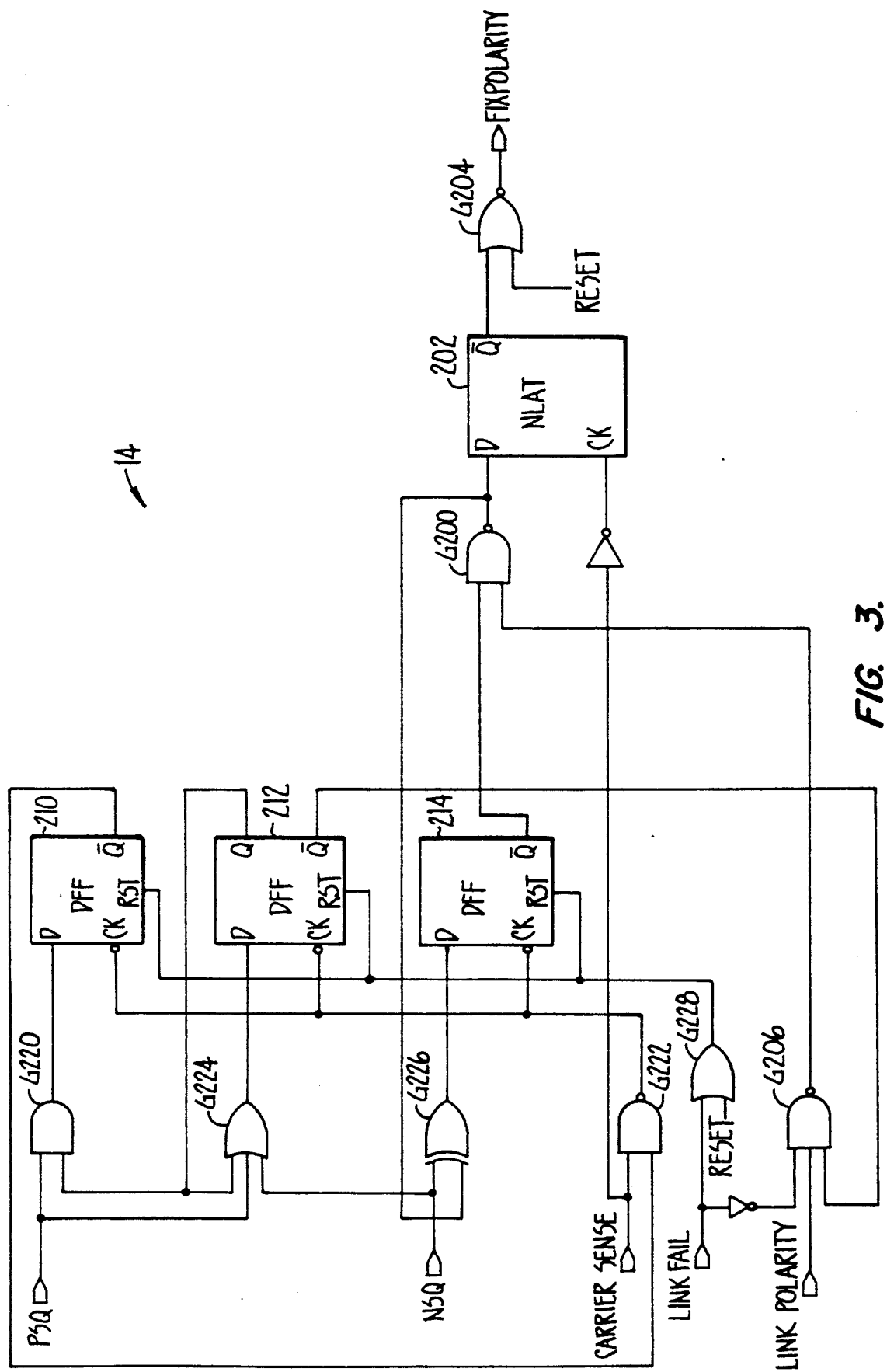
FIG. 3 is a detail block diagram of the polarity detection circuit 14 according to a preferred embodiment of the present invention.

FIG. 3 is a detail block diagram of the polarity detection circuit 14 according to a preferred embodiment of the present invention. The polarity detection circuit 14 receives six input signals, the PSQ, NSQ, carrier sense, linkfail, link polarity and the RESET signals to control the FIX POLARITY signal. There are two parts to the link polarity detection circuit, a ETD polarity part primarily responsive to the PSQ, NSQ and the carrier sense signals and a link polarity part primarily responsive to the linkfail and the link polarity signals. The two parts mutually coact to provide a reliable polarity detection apparatus in the preferred embodiment, with the ETD polarity part dominant. However, a system employing only one of the two parts may, in particular applications, be effective to provide satisfactory performance.

A dual-input NAND gate G200 merges information from the two parts to provide a data output to an NLAT 202. The NLAT 202 is an inverting output level sensitive latch which, for as long as a signal is asserted at a clock (CK) input, continually changes its output in response to logic changes at its data input (D). An inverted carrier sense signal controls the latching of the NLAT 202. A dual-input NOR gate G204 has the NLAT output as one input and the RESET signal as another input, with an output providing the FIX POLARITY signal.

The link polarity part comprises a triple-input NAND gate G206 which receives an inverted linkfail signal as one input and the link polarity signal as another signal. A control signal from the ETD polarity part permits the ETD polarity part to override the link polarity determinations and is input at the third input of the NAND gate G206. An output of the NAND gate G206 provides the polarity information of the link polarity part to one input of the NAND gate G200.

The ETD polarity part comprises three D flip-flops 210, 212 and 214, two dual-input AND gates G220 and G222, a triple-input OR gate G224, a dual-input XOR gate G226, and a dual input OR gate G228. The OR gate G228 has the linkfail signal as one input and the RESET signal as the other input and an output coupled to a reset input of the three D flip-flops 210, 212 and 214. An assertion of either the linkfail or the RESET signal deasserts all the D flip-flop outputs and asserts all the complementary outputs.

The D flip-flops 210, 212 and 214 have clock (CK) inputs which cause a logic level present at a data (D) input to latch to an output when the CK input transitions from a high to a low voltage level. An output signal from the NAND gate G222 provides the CK inputs to the D flip-flops 210, 212 and 214. The carrier sense signal is one input and a complementary output signal from the D flip-flop 210 is the other input. The D flip-flop 210 complementary output to the NAND gate G222 provides the locking mechanism for the polarity detection circuit 14. As long as the D flip-flop 210 asserts its complementary output, a falling edge of the carrier sense signal will clock the various D inputs of the D flip-flops. A deasserted complementary output of the D flip-flop 210 disables further changes in the D flip-flop values until the D flip-flops are reset.

An output signal of the AND gate G220 controls a logical value of the complementary output of the D flip-flop 210. The PSQ signal is one input of the AND gate G220 and a Q output of the D flip-flop 212 is the other input. Thus, concurrent assertions of both the output of the D flip-flop 212 and the PSQ signal when the carrier sense signal transitions to zero results in a deassertion of the complementary output of the D flip-flop 210. An assertion of the output of the D flip-flop 212 indicates a previous sampling of a valid ETD has occurred while the assertion of PSQ indicates the currently sampled ETD has a polarity consistent with the present polarity indicated by the FIX POLARITY signal. A complementary output of the D flip-flop 212 is the control signal to the link polarity part, that is the third input of the NAND gate G206. The signal, when asserted, indicates a valid ETD has not been received, therefore the link polarity should establish the initial polarity.

An output signal of the OR gate G224 controls a logical value of the output and the complementary output of the D flip-flop 212. The PSQ and NSQ signals and the output of the D flip-flop 212 are input signals of the OR gate G224. An assertion of any of the three input signals results in an assertion of the D flip-flop 212 output when the carrier sense signal falls.

An output of the XOR gate G226 controls a logical level value of a complementary output of the D flip-flop 214. The D flip-flop 214 stores information regarding detection of a reverse polarity of the input lines. The complementary output of the D flip-flop 214 is the output of the ETD polarity part and provides the second input into the NAND gate G200. The output of the NAND gate G200 is one input of the XOR gate G226, whose other input is the NSQ signal. An assertion of either one, but not both, of the inputs of the XOR gate G226 results in a deassertion of the D flip-flop 214's complementary output. This deassertion in turn asserts the G200 output, resulting in an ultimate assertion of FIX POLARITY signal. The connection of the NAND gate G200 output to the XOR gate G226 input allows the link polarity part to inform the data part as to the link polarity status upon receipt of a valid ETD.

In operation, the polarity detection circuit will initially use the value of the link polarity signal as the FIX POLARITY signal upon a deassertion of the linkfail signal. As soon as the SEQ circuit 20 detects an ETD and deassertion carrier sense, a D flip-flop will respond to an assertion of one of the PSQ or the NSQ signals. That is, an assertion of the PSQ signal will assert the output of the D flip-flop 212 logging a valid ETD as well as disabling the link polarity part by negating the complementary output. A second assertion of the PSQ signal will lock-in the FIX POLARITY signal, indicating that the link polarity part's initial determination was incorrect. An assertion of the NSQ signal on the other hand, will toggle the value of the FIX POLARITY signal by asserting the complementary output of the D flip-flop 214. Subsequent assertions of the NSQ signal will continue to toggle the value of the FIX POLARITY signal until an assertion of the PSQ signal locks-out further changes by disabling the carrier sense signal from clocking further changes.

Polarity Detection/Reversal (Alternate embodiment)

FIG. 17 is a block diagram of integrated circuit 52 including a CORELOGIC circuit 100, a TESTMUX circuit 102, an AUIPORT circuit 104 and a TWSTPRPORT circuit 106. CORELOGIC 100 performs the house keeping and logic functions of integrated circuit 52 and interface with TESTMUX 102 and AUIPORT 104 and TWSTPRPORT 106. The functions and operations of these circuits provide the features and meet the objectives of the present invention.

FIG. 7 is a functional block diagram further illustrating features of CORELOGIC 100. CORELOGIC 100 includes a testlogic 110 circuit, a SQETEST 112 circuit, a LINKTEST circuit 114, a jabber circuit 116 and a XMTRCV circuit 118.

This is the top-level logic schematic, which encompasses all the 'back-end' digital logic. CORELOGIC controls the function of the integrated circuit 52 drivers, receivers, and status pins. It is composed of five major circuit blocks (TESTLOGIC, XMTRCV, SQETEST, LINKTEST, and JABBER), a power-up reset circuit, and some random logic.

Input and Output Signals

The following is a list of CORELOGIC input and output signals, where the input signals come from, where the output signals eventually go, and their function.

LINKDET (input) This signal is generated by the twisted-pair receiver's smart squelch circuitry (RXLINK of the RDPWSQ circuit block). A link test pulse detected by the twisted-pair receiver generates a positive pulse approximately 20ns to 100ns+ wide, depending on the width and amplitude of the received link test pulse. LINKDET is monitored by the LINKTEST circuit.

RD_DATA (input) This signal is the manchester encoded data which is detected by the twisted-pair input receiver, smart squelch qualified, and amplified before being sent to the DI transmitter circuits. It is used by CORELOGIC to determine the received data polarity.

RDCRS (input) This is the RD data carrier sense signal which is generated by the twisted-pair receiver smart squelch circuitry. It is used primarily by the LINKTEST circuit and XMTRCV circuit within CORELOGIC.

DOCRS (input) This is the DO data carrier sense signal which is generated by the AUI DO+/− input squelch and pulse width qualification circuits. It is used primarily by the SQETEST, JABBER, and XMTRCV circuits within CORELOGIC.

NOT_SQETEST (input) This signal is taken directly from the NOT_SQETEST pad. The signal is buffered by TPXINBUF to accept TTL_level logic signals. NOT_SQETEST is primarily used to allow/inhibit the end-of-packet SQE heartbeat transmission on CI+/− and is also used by the SCAN PATH test circuitry as the SI (Scan In) serial input.

NOT_PRDN (input) This signal is an active LOW signal which is routed from the NOT_PRDN pad.

When PRDN is LOW it generates a system reset signal in CORELOGIC and shuts off the integrated circuit 52 bias current sources in the AUIPORT's VREF circuit. The PRDN signal is buffered by TPXINBUF to accept TTLG level logic signals.

PWRUPBIAS (input) This is a 2.5 µA (nominal) bias current from the AUIPORT's VREF circuit. It is used as a capacitor charging current in the CORELOGIC's PUPRST (power-up reset) circuit to provide a 10 µsec reset pulse during power-up.

RAWCLK10 (input) This signal is a 10MHz +/−15% (50% duty cycle) clock which is generated by the integrated circuit 52 VCO. This signal is suspended during system resets. It provides the clock for the CORELOGIC and its state machines and counters during normal operation.

TEST (input) This signal is connected directly to the integrated circuit 52 TEST pad. An input buffer, TPXINBUF, accepts TTL-level logic signals and provides output levels compatible with MOS logic. The TEST signal is used by the TESTLOGIC circuit to select Integrated circuit 52 test modes.

TEST2 (input) The TEST2 signal is used by the TESTLOGIC circuit for production testing.

SYSRST (output, optional) This active-HIGH control signal is the system reset enable. It resets the CORELOGIC circuits, the AUIPORT's TPEXVCO and AUIRCVSQ circuits, and the TWSTPRPORT's RDRCVSQ circuit. SYSRST also disables the 16mA output drivers (driving the RXPOL and LNKST pads) by driving them into the low-current (100µA, max) output-HIGH states.

STAT_RVRSPOL (input/output) This is an I/O signal which is routed to the RXPOL pad. As an active-LOW output, which is capable of sinking 16mA, it indicates whether the Integrated circuit 52 has received a packet with reversed polarity. As an input, it is buffered to accept TTL-level logic signals and is used to enable/disable the receive polarity correction circuitry.

LINK_FAIL (input/output) This is an I/O signal which is routed to the LNKST pad. As an active-LOW output, which is capable of sinking 16mA, it indicates whether the Integrated circuit 52 has entered the Link Fail state. As an input, it is buffered to accept TTL-level logic signals and is used to enable/ disable the Link Test Receive functions of the Integrated circuit 52.

STAT_RDCRS (output) This active-HIGH signal is routed to the RCV pad and goes HIG when RD data is detected by the twisted pair receiver and the Integrated circuit 52 is not in the Link Fail state. This output is capable of driving one TTL input.

STATE_DOCRS (output) This active-HIGH signal is routed to the XMT pad and goes HIGH when DO data is detected by the AUI receiver circuit and the Integrated circuit 52 is not in the Link Fail or Jabber states. This output is capable of driving one TTL input.

FIXPOL (output) This signal is used to control multiplexers in the twisted-pair RD data path which invert the RD data polarity. FIXPOL will be HIGH if a reversed packet was received and polarity reversal is enabled.

SQLCH_INHB (output) This signal is sent to the AUI DO+/− receiver and twisted pair RD+/− receiver circuits. When enabled, this signal defeats squelch on AUI DO+/− and RD+/−.

CIDRVEN (output) This signal is the enable control for the CI+/− output drive circuits. It is normally activated when SQE test (heartbeat), collision, or jabber conditions indicate that the 10MHz SQE signal must be transmitted onto the AUI CI+/− pair.

STATIC_TEST (output) This control signal is used in conjunction with production testing.

DITXENX (output) This signal is the enable control for the DI+/− output driver. It is normally activated when DO+/− data is looped back or when RD+/− data is to be sent to DI+/−.

TPDRVEN (output) This signal is the enable control for the TP+/− output drive circuits. It is normally activated when DO+/− data or a link pulse is to be sent to TP+/−. It is active during LOOPBACK-RPTR when RD data is to be sent to TP+/− TPDRVEN is also hardwired to the predistortion enable input to the TP+/− output driver.

RD2DICTL (output) This active-HIGH control signal enables the TESTMUX circuit to route RD data to the DI driver inputs.

LNKPLS (output) This active-HIGH control signal enables the TESTMUX circuit to route a logic-HIGH signal to the input of the TP+/− driver's data input. This control is active one bit-time before, during, and one bit-time after a link pulse transmission is performed to be certain only a HIGH pulse is transmitted onto the twisted-pair output lines.

RD2TDCTL (output) This active-HIGH control signal enables the TESTMUX circuit to route received RD data to the input of the TP+/− output driver.

NOT PWRDN (output) This active-LOW reset signal is a buffered signal from the NOT_PRDN pad. It is sent to the AUIPORT's VREF circuit where it shuts off the Integrated circuit 52 bias current sources when the chip enters the power-down mode.

PWRUP RESET (input) This active-HIGH reset signal is generated by a power-up circuit within CORE-LOGIC.

FIG. 12 is a schematic diagram of a subnetwork of FIG. 7 for reversing polarity of two signals, $V_{pos}$ and $V_{neg}$ if necessary.

FIG. 13 illustrates a plurality of waveforms which are relevant to a discussion of an preferred embodiment of an aspect of the present invention relating to polarity reversal. Waveform "A" is representative of Manchester encoding which is used for transmission of data wherein data and clock information are combined in a single bit stream. In Manchester coding, a transition from one signal state to a second signal state always occurs in a middle of each bit period, with a signal state during a first half of a bit period indicating a data value.

Data is sent in packets which is appropriately encoded, with a preamble portion of alternating 1's and 0's, a data portion which includes addressing and other signalling information and an end of transmission delimiter ("ETD") or start of idle signal as a concluding part. The ETD is to be at a high transition of at least two bit times, which is known as a violation in Manchester encoding. Note that the preamble begins with a negative transition, but the IEEE Standard 802.3 does not mandate that this first negative transition occur in the preamble. In other words, compatibility with IEEE Standard 802.3 is met without the negative transition, but the length of the ETD must always be at least a high level for at least two bit times to be compliant. Therefore, testing for the polarity of the initial pulse of the Manchester wave may be possible, but not viewed as reliable for the preferred embodiment.

Waveform B is a carrier sense signal developed by receiving circuitry associated with a differential receiver. After an input signal is recognized as Manchester code, the carrier sense signal is asserted and remains asserted during receipt of the signal. If transitions do not occur during a prespecified time interval, such as during the ETD concluding portion of a transmission, then the carrier sense signal is negated.

Waveform C is representative of Waveform A which has been inverted, such as would occur if RD1 and RD0 were reversed in a connection to a particular MAU.

FIG. 12 is a schematic block diagram illustrating circuitry which will automatically reverse incorrectly wired receive RD1 and RD0 lines. The reader will appreciate that an internal rerouting of signals is accomplished by the present invention, rather than simply inverting each of the signals. While invention will produce a correct signal and may be satisfactory in certain applications, it was not used in the preferred embodiment because inversion may introduce undesirable jitter to a received signal.

A polarity sensing circuit 260 is provided for receipt of a RD_DATA signal which is a differential Manchester encoded signal of the type illustrated by waveform A of FIG. 13. RD_DATA signal is produced by taking a difference between a first part of the signal received from a first line, $V_{pos}$, and a second part of the signal received from a second line, $V_{neg}$. A carrier sense ("RD_CRS") signal similar to waveform B of FIG. 13 associated with RD_DATA is also provided to polarity sensing circuit 260.

Additional signals present are a RESET signal which is present after a power up or a reset command is issued. Additionally, a link status signal is provided to indicate that a link integrity test as indicated above has failed. RESET and LNKST signals are provided to logic gate $G_1$ which will assert a second reset signal if either of the RESET or the LNKST signals are asserted. The reader will appreciate that assertion of a signal does not necessarily identify a voltage level associated with that signal. For example, the NOR gate implementation of logic gate $G_1$ actually provides a low level when any of the inputs are high. This low state of the second reset signal is a signal indicating that a reset function is desired, and is an assertion of that desire. Equivalents to any particular implementation of a manner of conveying that signal will occur to the reader and the particular implementation should not be viewed as a limitation.

An aspect of the present invention is to detect and correct incorrectly wired wires of a network media, as may occur if twisted pair cable is used a transmission medium. A receiver, able to correct for reversed wiring, may still receive information from the network which would otherwise be lost. An approach taken with the present invention is to test a polarity of a first packet and establish from that first packet whether to reverse or not for the rest of a session until some event occurs which indicates that a reversal of the receive wires may have occurred or that a check is desired. The reset modes are chosen to identify those times when it may be desirous of rechecking the status of the connection. After a reset or power up mode is commanded, the system will check for correct polarity as faulty connection could have been made. Additionally, if a idle mode as described above is initiated, then reversal should be checked when the system commences operations again. Upon failure of the link integrity test, which may occur upon disconnection from the network, a test of the polarity is desired when operation recommences.

Therefore, the second reset signal is provided to a latch 262 and to a latch 264. Latch 262 and latch 264 are D-type flip-flops which will latch data from its "D" terminal upon a low to high transition of a clock signal present on its respective clock ("CL") terminal. The second reset signal will put latch 262 and latch 264 into a prespecified state, with a "Q" output held low and "$\overline{Q}$" output held high. $\overline{Q}$ of latch 262 is coupled to a second logic gate $G_2$ whose output is provided as the clock input to latch 262 and to latch 264. The particular implementation of logic gate $G_2$ is to provide a low to high transition of the clock signals when the carrier sense signal goes from high to low. Latch 262 is used to ensure that only a first packet received after any of the above described reset conditions are asserted is used to establish whether reversal is necessary or not. It is assumed that polarity cannot change during operation unless one of the reset conditions are asserted, which will check the reversal status in any event. However, if it is desired to check polarity after every packet, latch 262 is not needed and logic gate $G_2$ may be replaced by a simple invertor.

When the carrier sense signal undergoes its high to low transition, the RD_DATA present at the D input of Latch 264 is either a high value or a low value, See FIG. 13, waveforms A and C. If the wiring is correct, then when the carrier sense signal goes low, a high value will be present at D of latch 264 and will be held at Q output of latch 264. If the wiring is incorrect, then a low value, complementary to the high value, will be clocked into latch 264 and output at Q. The reader will appreciate that the carrier sense signal is relatively independent from the coded data, and will undergo a high to low transition not upon detecting the ETD directly as a high for occurring greater than two bit times. Rather, carrier sense detects ETD because the ETD does not have any transitions and an associated timing circuit will determine that a Manchester signal is no longer present and will cause a negation of the carrier sense signal. By monitoring the ETD value when the carrier sense negative occurs, reversal of the receive lines is indicated by the value of the ETD line.

Logic gate $G_3$ is coupled to latch 262 and latch 264 and responsive to $\overline{Q}$ and Q. Logic gate $G_3$ will assert a reverse polarity signal if latch 264 has latched the complementary value and if latch 262 has latched a low value to its $\overline{Q}$ output, indicating that the first packet since the assertion of the second reset signal has been detected.

Four transmission gates $TG_1$–$TG_4$, CMOS switches, are provided for proper routing of the signals which will reverse the inputs if necessary. If the reverse polarity signal is not asserted, then $TG_1$ and $TG_2$ will transmit signals from $V_{pos}$ and $V_{neg}$, respectively, directly to processing circuitry for the respective signals. If the reverse polarity signal is asserted, then $TG_3$ will route signals from $V_{neg}$ to the processing circuitry intended for $V_{pos}$ signals. Similarly, $TG_4$ routes $V_{pos}$ signals to the processing circuitry intended for $V_{neg}$ signals. Thus, reversal of polarity reversed wires is automatically attained.

As discussed above, invertors could be used in lieu of the plurality of transmission gates $TG_1$–$TG_4$, but at the risk that unacceptable jitter may be introduced.

INHIBITING POLARITY REVERSAL

FIG. 14 is a schematic block diagram illustrating a preferred implementation of a polarity sensing circuit 260' which will permit polarity reversal to be inhibited by a user. When inhibiting polarity reversal, node $N_1$ is coupled to a ground voltage. If node $N_1$ is allowed to float, polarity reversal is enabled, and an indicator, such as a light emitting diode ("LED") may be coupled to node $N_1$ to permit a status of polarity reversal and detection to be monitored.

Polarity sensing circuit 260' includes the circuit components of differential receives 260 with additional circuitry to inhibit and indicate polarity reversal status. Logic gate $G_4$ is coupled to Q of latch 264 and will assert a signal if polarity is correct. Logic gate $G_5$ is used to implement various test functions, not relevant to the present discussion and will not be further discussed except to address that the output of logic gate $G_5$ is high except in any of the test modes. Thus, when Q is high, indicating correct polarity, a low is asserted to a buffer 266.

FIG. 15 is a schematic circuit diagram of a preferred embodiment for buffer 266, as well as a truth table illustrating its operation. As illustrated, output of buffer 266 will be low when polarity is correct, or when node $N_{12}$ is coupled to ground. This buffer 266 provides a mechanism to implement the inhibiting feature and status indication from a single node, or pin for differential receiver 260' implemented as a single integrated circuit. Buffer 266 includes a PMOS transistor device and a NMOS transistor device. For the preferred implementation, the NMOS transistor device is to sink much more current than the PMOS transistor device, approximately 100 times or greater current.

If node $N_1$ is low, this indicates that either the polarity is correct or that reversal is inhibited. Note $N_1$ being high indicates that reversal is not inhibited and that polarity is incorrect. The status of node $N_1$ is transmitted by buffer 268 to an CMOS latch 270.

FIG. 16 is a schematic diagram of CMOS latch 270. CMOS latch 270 is a level sensitive latch (also commonly referred to as a transparent latch) which will propagate data from buffer 268 to an inverting output while its clock input is high and latching the data on the falling edge of the clock. A logic gate $G_6$ is provided to invert a clock input, the carrier sense signal, to provide a logic high level clock signal when carrier sense signal is negated. When carrier sense signal is negated, the status of node $N_1$ is propagated to the inverting output of CMOS latch 270. Therefore, if polarity reversal is inhibited or not necessary, $Q_F$ will be high. A low signal on $Q_F$ indicates that polarity is reversed and enabled. CMOS latch 270 output $Q_F$ is provided to logic gate $G_3$ with the first packet signal and the value of the ETD pulse of the first packet. If all three are low, for this implementation, then polarity reversal will be performed.

Buffer 266 is configured with a relatively large NMOS transistor device (in current handling terms) to that of the PMOS transistor device. This permits the NMOS device to sink sufficient current, approximately 10–15 mA, to drive an LED. The LED will illuminate, in the preferred embodiment, only when polarity is correct. The reader will appreciate that when polarity is incorrect and node $N_1$ is grounded, that is small current will flow from the PMOS transistor device to ground, which explains why the PMOS device is relatively small.

FIG. 9B through FIG. 11 are block schematic diagrams of AUIPORT 104 of FIG. 5 illustrating implementation of the impedance presented to AUI 30 during idle mode.

FIG. 8 is a block schematic diagram of AUIPORT 104 showing its functional subunits. These subunits include a VREF circuit 140, a twisted pair MAU 50 power circuit 142 ("TPEXVCO") an AUIXMTTR circuit 144, an AUIRCV circuit 146, an AUICI circuit 148 and an AUIRCVSQ circuit 150.

FIG. 9 is a circuit schematic diagram of VREF circuit 140 which supplies power to the circuits of AUIPORT 104. If NOT_PWRDN is low, or asserted, then a gate to source voltage of a PMOS transistor device coupled to NOT_PWRDN becomes active, initiating power to be supplied to the other circuits as the reader will readily appreciate.

FIG. 10 is a schematic diagram of AUIXMTTR circuit 144. FIG. 11 is a schematic diagram of AUIRCV circuit 146.

By implementing AUIPORT 104 as described, a low impedance may be presented to AUI 30 in an idle mode.

In conclusion, the present invention enhances performance of automatic polarity detection methods and apparatus by using linkpulse information to establish an initial polarity determination in an absence of data packet transmissions on a network. The reliance on the use of the ETD polarity information to lock-in a particular polarity provides greater immunity from noise on the input lines. While the above is a complete description of the preferred embodiment of the present invention, it is possible to use various alternatives, modifications and equivalents. For example, various signals having ETDs received as a differential signal could be corrected by use of the present invention. Additionally, signals characterized as keep-alive signals or heartbeat signals which have a particular polarity or transition sequence could be implemented similarly to the linkpulse signal circuits. The RESET LNKCNT signal in FIG. 1 does not necessarily need to be used; the Linktest circuit 26 can be utilized to discriminate noise from actual link pulses instead of using both the Link Pulse Reversal circuit 24 and Linktest circuit 26 to check pulse validity. In this variation, the LINK POLARITY signal can be used by itself to determine polarity, or, LINK POLARITY can be qualified by the RESET LNKCNT signal to indicate the LINK POLARITY signal accuracy by inverting RESET LNKCNT and adding it as another input to gate G-206 in FIG. 3. Therefore, the above description does not limit the scope of the present invention. Rather, the appended claims define the present invention.

What is claimed is:

1. A differential signal polarity reversal detection apparatus, comprising:
   means for receiving a differential signal from a first and second input with said differential signal having a prespecified signal format;
   means, coupled to said first and second inputs, for sampling said differential signal and recognizing said prespecified signal format, said sampling and recognizing means asserting a recognition signal upon recognition of said prespecified format; and
   means, coupled to said receiving means and to said sampling and recognizing means and responsive to said recognition signal, for detecting an incorrect polarity of said differential signal received on said first and second inputs.

2. The differential signal polarity reversal detection apparatus of claim 1 wherein said prespecified format includes a predefined end-of-transmission delimiter.

3. The differential signal polarity reversal detection apparatus of claim 2 wherein the sampling and recognizing means asserts said recognition signal upon detecting a particular transition sequence for said differential signal.

4. The differential signal polarity reversal detection apparatus of claim 3 wherein said sampling and recognizing means deasserts said signal upon detecting said end of said end-of-transmission delimiter.

5. The differential signal polarity reversal detection apparatus of claim 1 wherein said prespecified format corresponds to a linkpulse.

6. The differential signal polarity reversal detection apparatus of claim 5 wherein the sampling and recognizing means asserts said recognition signal upon detecting a particular transition sequence for said differential signal.

7. The differential signal polarity reversal detection apparatus of claim 6 further comprising:
   means, coupled to the detecting means, for asserting a fix polarity signal, said fix polarity signal having a first state indicating said first and second inputs have a correct polarity and said fix polarity signal having a second state indicating said first and second inputs have a reversed polarity.

8. The differential signal polarity reversal detection apparatus of claim 7 further comprising:
   means, coupled to the asserting means and to said first and second inputs, for remedying said reversed polarity if said fix polarity signal is in said second state.

9. The differential signal polarity reversal detection apparatus of claim 8 wherein the remedying means includes means for rerouting signals at said first and second inputs to said second and first inputs, respectively.

10. The differential signal polarity reversal detection apparatus of claim 9 further comprising:
    means, coupled to the detecting means, for inhibiting said polarity signal from having said second state.

11. A differential signal polarity reversal detection apparatus, comprising:
    means for receiving a differential signal from a first and second input with said differential signal having a prespecified signal format including an end-of-transmission delimeter;
    means, coupled to said first and second inputs, for sampling said differential signal and recognizing said prespecified signal format, said sampling and recognizing means asserting a recognition signal upon recognition that said prespecified format of said differential signal includes a particular transition sequence, and said sampling and recognizing means deasserting said signal upon detecting said end-of-transmission delimeter; and
    means, coupled to said receiving means and to said sampling and recognizing means and responsive to said recognition signal, for detecting an incorrect polarity of said differential signal received on said first and second inputs.

12. The differential signal polarity reversal detection apparatus of claim 11 wherein said detecting means samples one of said first and second inputs for a particular voltage level when said signal is deasserted, said detecting means establishing that said first and second inputs have a correct polarity if said particular voltage level has a first voltage level within a first range and said detecting means establishing that said first and second inputs have a reversed polarity if said particular voltage level has a second voltage level within a second range.

13. The differential signal polarity reversal detection apparatus of claim 12 further comprising:
   means, coupled to the detecting means, for asserting a fix polarity signal, said fix polarity signal having a first state indicating said first and second inputs have said correct polarity and said fix polarity signal having a second state indicating said first and second inputs have said reversed polarity.

14. The differential signal polarity reversal detection apparatus of claim 13 further comprising:
   means, coupled to the asserting means and to said first and second inputs, for remedying said reversed polarity if said fix polarity signal is in said second state.

15. The differential signal polarity reversal detection apparatus of claim 14 wherein the remedying means includes means for rerouting signals at said first and second inputs to said second and first inputs, respectively.

16. The differential signal polarity reversal detection apparatus of claim 15 further comprising:
   means coupled to said detecting means, for inhibiting said fix polarity signal from having said second state.

17. The differential signal polarity reversal detection apparatus of claim 15 further comprising:
   means, coupled to the detecting means, for locking-in polarity correction after receipt of a prespecified number of consistent and valid end-of-transmission delimiters.

18. A differential signal polarity reversal detection circuit, comprising:
   a first and a second input for receipt of complementary differential signals and linkpulse signals;
   means, coupled to said first and second inputs, for asserting a carrier sense signal while a first and a second input signal at said first and second inputs, respectively, correspond to a valid prespecified format;
   means, coupled to said first and second inputs, for asserting one of a first and a second link signal if an input signal at said first and second inputs, respectively, corresponds to a linkpulse signal;
   means, coupled to said first and second link signals, for asserting a link polarity signal if said asserted one of said first and second link signals indicate said first and second inputs have a reversed polarity, said link polarity signal asserting means deasserting said link polarity signal if said asserted one of said first and second link signals indicates said first and second inputs have a correct polarity;
   means, coupled to said first and second inputs and responsive to said carrier sense signal, for asserting an end-of-transmission delimeter polarity signal if said first and second inputs have reversed polarity based upon receipt of a valid end-of-transmission delimeter having a first voltage range, said end-of-transmission delimeter polarity signal asserting means deasserting said end-of-transmission delimeter polarity signal if said first and second inputs have correct polarity based on receipt of a valid end-of-transmission delimeter having a second voltage range; and
   means, coupled to said end-of-transmission delimeter polarity signal asserting means and to said link polarity signal asserting means, for asserting a fix polarity signal if either one of said end-of-transmission delimeter polarity and said link polarity signals is asserted.

19. The differential signal polarity reversal detection circuit of claim 18 further comprising:
   means, coupled to the fix polarity signal asserting means, for providing said end-of-transmission delimeter polarity signal with precedence over said link polarity signal in control of said fix polarity signal.

20. The differential signal polarity reversal detection circuit of claim 18 further comprising:
   means, coupled to the fix polarity signal asserting means, for remedying a reversed polarity if said fix polarity signal is asserted.

21. A method for correcting a reversed polarity for a differential signal, comprising the steps of:
   receiving a first and a second input differential input signal;
   establishing whether said first and second input signals have a pulse width within a prespecified range for linkpulse determination;
   asserting a link polarity signal if said first and second input signals have said pulse width within said specified range and said input signals are inverted linkpulse signals;
   establishing whether said first and second input signals comprise valid end-of-transmission delimiters;
   asserting an end-of-transmission delimeter polarity signal if said valid end-of-transmission delimiter comprises an inverted end-of-transmission delimeter and deasserting said end-of-transmission delimeter polarity signal if a subsequent end-of-transmission delimeter establishment of said input signals indicates said input signals are inverted;
   asserting a fix polarity signal if said link polarity signal is asserted until a deassertion of said end-of-transmission delimeter polarity signal, said fix polarity signal also asserted if said end-of-transmission delimeter polarity signal is asserted; and
   remedying a reversed polarity if said fix polarity signal is asserted.

22. The method of claim 21 wherein said remedying step includes the step of rerouting input signals received at said first input to travel a path that signals received at said second input would travel in an absence of said assertion of said fix polarity signal, and rerouting input signals received at said second input to travel a path that signals received at said first input would travel in an absence of said assertion of said fix polarity signal.

23. A differential signal polarity-reversal detection and correction apparatus, comprising:
   a polarity corrector for receiving a plurality of differential signals each having a first signal component on a first input and a second signal component on a second input, said polarity corrector transmitting said signal components of said plurality of differential signals respectively from a first and a second output, said polarity corrector responsive to an assertion of a fix polarity signal to correct a reversed polarity of said plurality of differential signals;

a first and a second threshold detection circuit, coupled respectively to said first and second outputs of said polarity corrector for transmitting a thresholded signal component meeting a predetermined criteria;

a sequence detector, coupled to outputs of said first and said second threshold circuit, for asserting a carrier sense signal when a series of said threshold signal components indicate that said plurality of differential signals make up a Manchester-encoded data packet and for subsequently deasserting said carrier sense signal when said data packet terminates; and a polarity detector, coupled to said threshold detection circuits, said polarity corrector and to said sequence detector, for asserting said fix polarity signal to said polarity corrector responsive to said thresholded signals components indicating a reversed polarity for said plurality of differential signals when said carrier sense signal is deasserted.

24. The polarity-reversal apparatus of claim 23 wherein said polarity corrector includes means for directing said first signal components at said first input to said second output and for directing said second signal components at said second input to said first output to correct said reversed polarity.

25. The polarity-reversal apparatus of claim 23 wherein said polarity corrector includes means for inverting said first and said second signal components to correct said reversed polarity.

26. The polarity-reversal apparatus of claim 23 wherein said polarity detector includes means for inhibiting changes of said fix polarity signal after a predetermined number of receipts of successive consistent differential signals without an indication of a reversed polarity condition.

27. The polarity-reversal apparatus of claim 23 further comprising:

a pulse-width detector, coupled to said outputs of said thresholding circuits, for asserting said first and second signal components as link pulse signals when said first and second signal components meet a predetermined pulse-width value; and a link pulse reversal detector, coupled to said pulse-width detector and to said polarity detector, for monitoring said link pulse signals, said link pulse reversal detector asserting a link polarity signal to said polarity detector when it detects a reversed polarity of said differential signals, wherein said polarity detector is responsive to said assertion of said link polarity signal to assert said fix polarity signal.

28. The polarity-reversal apparatus of claim 27 further comprising:

means, coupled to said link pulse reversal detector and to said polarity detector and responsive to said link polarity signal, for performing a linktest using said link pulse signals, said linktest performing means asserting a linkfail signal when said linkpulse signals do not pass a predetermined test, wherein said polarity detector, responsive to said linkfail signal, inhibits changes to a state of said fix polarity signal when said linkfail signal is not asserted.

29. The polarity-reversal apparatus of claim 27 wherein said polarity detector means an initial determination of a state of said fix polarity signal based on said link polarity signal and thereafter inhibits changes in said state of said fix polarity signal when said thresholded signal components indicate a polarity for said plurality of differential signals, when said carrier sense signal is deasserted, corresponding to said polarity determined by said link pulse reversal detector.

30. A differential receiver receiving a signal represented as a difference between a first signal from a first line and a second signal from a second line wherein the first and second signals have an introductory portion, a data portion and a concluding portion, wherein a sense signal is asserted when the introductory portion is detected and the sense signal is negated when the concluding portion is detected and wherein the first signals are processed by a first circuit and the second signals are processed by a second circuit, comprising:

means, coupled to the differential receiver and responsive to the signal, for asserting a reverse polarity signal if the first signal is present on the second line and the second signal is present on the first line; and means, coupled to said asserting means and responsive to an assertion of said reverse polarity signal, for directing said first signal to the second circuit and for directing said second signal to the first circuit.

31. The differential receiver of claim 30 further comprising:

means, coupled to the asserting means and responsive to only a first sense signal occurring after a first predetermined condition of said differential receiver, for disabling the asserting means from changing a state of said reverse polarity signal until a second predetermined condition of said differential receiver is attained.

32. The differential receiver of claim 30 further comprising:

means for disabling the asserting means from asserting said reverse polarity signal.

33. The differential receiver of claim 31 further comprising:

means for disabling the asserting means from asserting said reverse polarity signal.

34. The differential receiver of claim 32 wherein the disabling means indicates a status of said reverse polarity signal if the disabling means id not disabling said asserting means.

35. The differential receiver of claim 33 wherein the disabling means indicates a status of said reverse polarity signal if the disabling means is not disabling said asserting means.

36. A differential receiver receiving a first and a second part of an encoded signal having an introductory part, a data part and a concluding part of a prespecified value on a first line and a second line, respectively, with the first part processed by a first circuit and a second part processed by a second circuit wherein a sense signal is asserted during the introductory part and negated during the concluding part of the encoded signal, comprising:

a first latch, responsive to the negation of the sense signal, to hold a value of the concluding part of the encoded signal when said sense signal is negated, said value equal to the prespecified value if a polarity of the first and second lines is correct, otherwise said value equal to a complementary value of said prespecified value if said polarity is incorrect;

a first transmission gate, coupled to said first latch, to said first line and to the first processing circuit, for directing the first part of said encoded signal to said first processing circuit if said held value is said prespecified value;

a second transmission gate, coupled to said first latch, to said second line and to the second processing circuit, for directing the second part of said encoded signal to said second processing circuit if said held value is said prespecified value;

a third transmission gate, coupled to said first latch, to said first line and to said second processing circuit, for directing the first part of said encoded signal to said second processing circuit if said held value is said complementary value of said prespecified value; and a fourth transmission gate, coupled to said first latch, to said second line and to said first processing circuit, for directing the second part of said encoded signal to said first processing circuit if said held value is said complementary value of said prespecified value.

37. A differential receiver receiving a first and a second part of an encoded signal having an introductory part, a data part and a concluding part of a prespecified value on a first line and a second line, respectively, with the first part processed by a first circuit and a second part processed by a second circuit wherein a sense signal is asserted during the introductory part and negated during the concluding part of the encoded signal, comprising:

a first latch, responsive to the negation of the sense signal, to hold a value of the concluding part of the encoded signal when said sense signal is negated, said value equal to the prespecified value if a polarity of the first and second lines is correct, otherwise said value equal to a complementary value of said prespecified value if said polarity is incorrect;

a second latch, coupled to the first latch and responsive to only a first negation of the sense signal to assert a first packet signal for indicating a first packet after a predetermined condition has been received, said first latch responsive to said first packet signal to provide said held value only with a value of said first packet's concluding part;

a logic gate, coupled to said first and second latch and responsive to said held value and to said first packet signal for asserting a reverse polarity signal if said first packet signal is asserted and if said held value of said first packet is said, complementary value of said prespecified value, otherwise said logic gate negating said reverse polarity signal;

a first transmission gate, coupled to said logic gate, said first line and to the first processing circuit, for directing the first part of said encoded signal to said first processing circuit if said reverse polarity signal is negated;

a second transmission gate, coupled to said logic gate, to said second line and to the second processing circuit, for directing the second part of said encoded signal to said second processing circuit if said reverse polarity signal is negated;

a third transmission gate, coupled to said logic gate, to said first line and to said second processing circuit, for directing the first part of said encoded signal to said second processing circuit if said reverse polarity signal is asserted; and a fourth transmission gate, coupled to said logic gate, to said second line and to said first processing circuit, for directing the second part of said encoded signal to said first processing circuit if said reverse polarity signal is asserted.

38. The differential receiver of claim 37 further comprising:

a buffer circuit, coupled to said first latch and responsive to a voltage level present at a node, for asserting a reverse inhibit signal if said held value is said complementary value and said voltage level is a first value; and an CMOS latch, coupled to said buffer circuit and to said logic gate and responsive to said sense signal and to said reverse inhibit signal, for asserting a reversal proceed signal if said reverse inhibit signal is not asserted when said sense signal is negated;

wherein said logic gate is further responsive to said reversal proceed signal to assert said reverse polarity signal only when said held value is said complementary value, said first packet signal is asserted, and said reversal proceed signal is asserted.

39. The differential receiver of claim 38 wherein said buffer circuit further comprises:

an input terminal, a reset terminal and an output terminal, said output terminal coupled to said node;

a plurality of logic gates, coupled to said input terminal and said reset terminal, for asserting a first and a second buffer signal when said held value is said prespecified value and a reset signal is negated;

a PMOS transistor device having a gate terminal, a source terminal and a drain terminal, said gate terminal coupled to said plurality of logic gates, said source terminal coupled to a second voltage level and said drain terminal coupled to said output terminal, said PMOS transistor responsive to said assertion of said first buffer signal to drive said output terminal substantially to said second voltage unless said node is coupled to said first voltage level; and an NMOS transistor device having a gate terminal, a source terminal and a drain terminal, said gate terminal coupled to said plurality of logic gates, said source terminal coupled to said second voltage level and said drain terminal coupled to said output terminal, said NMOS transistor device responsive to a negation of said second buffer signal to drive said output terminal substantially to said first voltage level.

40. The differential receiver of claim 39 wherein said NMOS transistor device sinks a current sufficient to drive an device indicating that polarity is not reversed when said output terminal is substantially at said first voltage level.

41. The differential receiver of claim 40 wherein said first and second latch, said logic gate, said buffer, said CMOS latch and said transmission gates are well integrated into a single chip and said output terminal is coupled to an external pin of said single chip.

42. A differential receiver receiving a signal represented as a difference between a first signal from a first line and a second signal from a second line wherein the first and second signals have an introductory portion, a data portion and a concluding portion, wherein a sense signal is asserted when the introductory portion is detected and the sense signal is negated when the concluding portion is detected and wherein the first signals are processed by a first circuit and the second signals are processed by a second circuit, comprising:

means, coupled to the differential receiver and responsive to the signal, for asserting a reverse polarity signal if the first signal is present on the second line and the second signal is present on the first line; and means, coupled to said asserting mean and responsive to an assertion of said reverse polarity signal, for inverting said first signal and said second signal and directing said first inverted signal to the first circuit and for directing said second inverted signal to the second circuit.

43. A differential receiver for detecting a reversal of wiring for a first line and a second line, each line receiving a first part and a second part respectively of an encoded signal having an introductory part, a data part and a concluding part of a prespecified value, comprising:

means for asserting a sense signal during the introductory part of the second signal and for negating said sense signal said concluding part of said encoded signal;

a first latch, responsive to the negation of the sense signal, to hold a value of the concluding part of the encoded signal when said sense signal is negated, said held value equal to the prespecified value if a polarity of the first and second lines is correct, otherwise said value equal to a complementary value of said prespecified value if said polarity is incorrect; and means, coupled to said first latch, for asserting a reverse polarity signal if said held value is equal to said complementary value.

44. A differential receiver for detecting a reversal of wiring for a first line and a second line, each line receiving a first part and a second part respectively of an encoded signal having an introductory part, a data part and a concluding part of a prespecified value, comprising:

first means for asserting a sense signal during the introductory part of the encoded signal and for negating said sense signal during said concluding part of said encoded signal;

a first latch, responsive to the negation of the sense signal, to hold a value of the concluding part of the encoded signal when said sense signal is negated, said held value equal to the prespecified value if a polarity of the first and second lines is correct, otherwise said value equal to a complementary value of said prespecified value if said polarity is incorrect; and second means, coupled to said first latch, for asserting a polarity acceptable signal if said held value is equal to said prespecified value.

45. The differential receiver of claim 44 further comprising:

a second latch, coupled to the first latch and responsive to only a first negation of the sense signal to assert a first packet signal for indicating a first packet after a predetermined condition has been received, said first latch responsive to said first packet signal to provide said held value only with a value of said first packet's concluding part, wherein said second asserting means includes a logic gate, coupled to said first and second latch and responsive to aid held value and to said first packet signal for asserting as reverse polarity signal if said first packet signal is asserted and if said held value of said first packet is said complementary value of said prespecified value, otherwise said logic gate negating said reverse polarity signal.

* * * * *